(12) United States Patent
Yu

(10) Patent No.: US 12,044,646 B2
(45) Date of Patent: Jul. 23, 2024

(54) FLUID SENSOR SYSTEM

(71) Applicant: TAIWAN SEMICONDUCTOR MANUFACTURING COMPANY LTD., Hsinchu (TW)

(72) Inventor: Chwen Yu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 119 days.

(21) Appl. No.: 17/321,130

(22) Filed: May 14, 2021

(65) Prior Publication Data
US 2022/0365019 A1 Nov. 17, 2022

(51) Int. Cl.
*G01N 27/22* (2006.01)
*B81C 1/00* (2006.01)

(52) U.S. Cl.
CPC ....... *G01N 27/226* (2013.01); *B81C 1/00531* (2013.01); *G01N 27/227* (2013.01); *B81C 2201/0143* (2013.01)

(58) Field of Classification Search
CPC .............. G01N 27/226; G01N 27/227; B81C 1/00531; B81C 2201/0143
See application file for complete search history.

(56) References Cited

U.S. PATENT DOCUMENTS

| | | | | |
|---|---|---|---|---|
| 5,393,401 A | * | 2/1995 | Knoll | G01N 27/414 257/253 |
| 7,006,929 B2 | * | 2/2006 | Oka | G01N 33/48728 324/692 |
| 10,029,915 B2 | * | 7/2018 | Afzali-Ardakani | G01N 27/00 |
| 2002/0014106 A1 | * | 2/2002 | Srinivasan | B01J 19/0046 73/23.42 |
| 2002/0182627 A1 | * | 12/2002 | Wang | G01N 33/5005 435/7.9 |
| 2003/0121313 A1 | * | 7/2003 | Sparks | G01N 15/0656 73/38 |
| 2015/0293050 A1 | * | 10/2015 | Kuriyama | H01J 37/22 250/453.11 |
| 2019/0120816 A1 | * | 4/2019 | Liu | B81C 1/00119 |
| 2020/0056978 A1 | | 2/2020 | Lin et al. | |
| 2020/0109476 A1 | * | 4/2020 | Lei | C23F 4/00 |
| 2021/0018457 A1 | | 1/2021 | Yu | |

OTHER PUBLICATIONS

T. Petäjä, G. Mordas, H. Manninen, P. P. Aalto, K. Hämeri & M. Kulmala, Detection Efficiency of a Water-Based TSI Condensation Particle Counter 3785, Aerosol Science and Technology, 40:12, 1090-1097, 2006.

* cited by examiner

*Primary Examiner* — Feba Pothen
(74) *Attorney, Agent, or Firm* — WPAT LAW; Anthony King

(57) ABSTRACT

The present disclosure provides a fluid sensor and a method for fabricating a fluid sensor. The fluid sensor includes a substrate including a first material and having a first surface and a second surface opposite to the first surface, wherein the substrate further comprises a recess recessed from the first surface, a first conductive layer over the first surface of the substrate, a protection layer between the first surface of the substrate and the first conductive layer, wherein the protection layer includes a second material, and a through via connected to the recess.

20 Claims, 32 Drawing Sheets

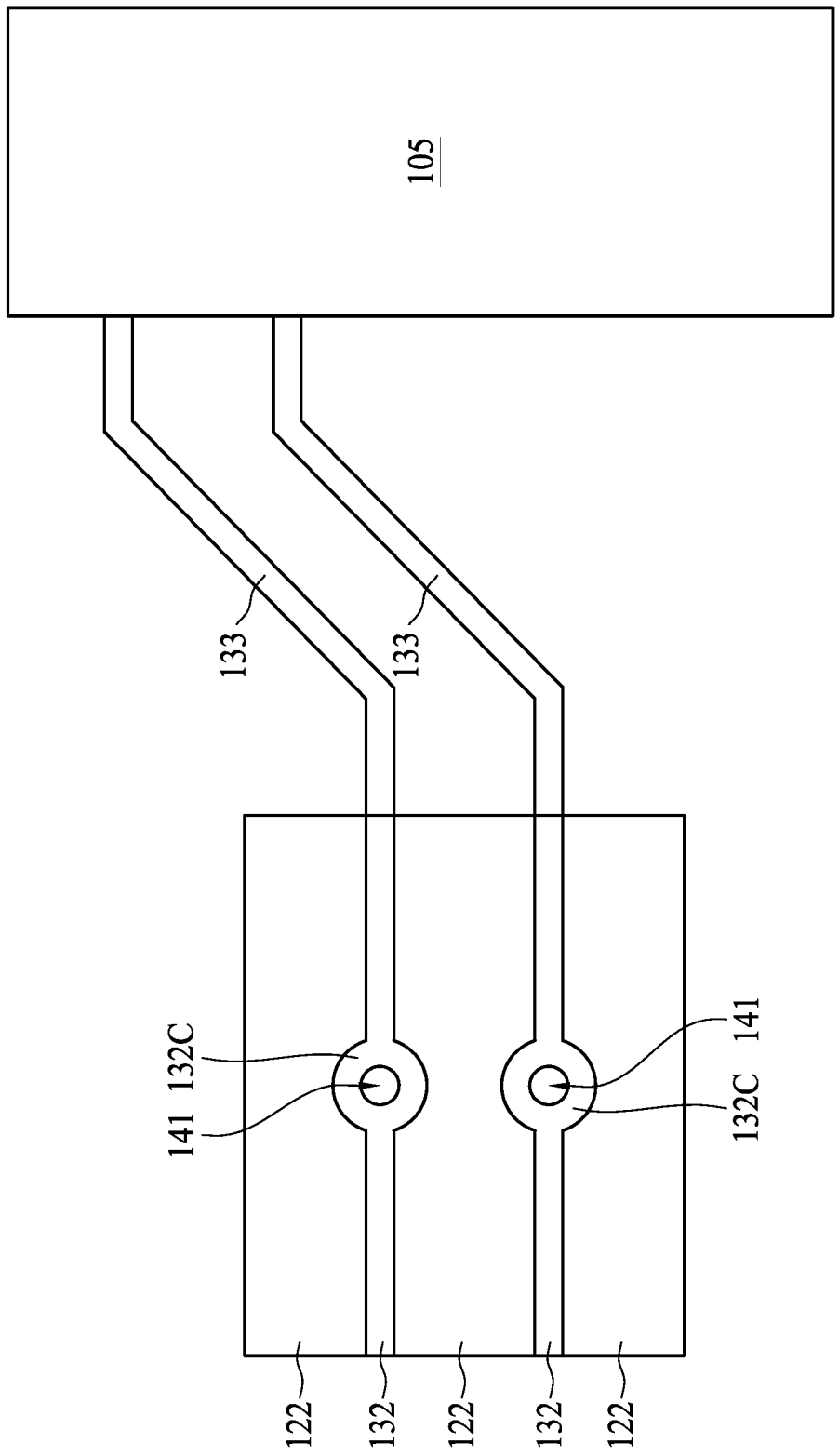

FLUID SENSOR SYSTEM

BACKGROUND

In the fabrication of semiconductor integrated circuit (IC) devices, various device features such as insulating layers, conductive layers, semiconductive layers, etc., are formed on a semiconductor substrate. It is well known that the processes in which these features are formed are factors in quality of a fabricated IC device. In addition, the quality of the fabricated device and the cleanliness of the manufacturing environment in which the IC device is processed are, in turn, factors in the yield of an IC fabrication process.

The ever-increasing trend of miniaturization of semiconductor IC devices in recent years requires more stringent control of the cleanliness in the fabrication process and in the processing chamber where the process is conducted. This includes more stringent control of the maximum amount of impurities and contaminants that are allowed in a process chamber. When the dimension of a miniaturized device approaches the sub-half-micron level, even a minutest amount of contaminants can significantly reduce the yield of the IC manufacturing process. For instance, the number of particles in fluid used in the process may raise yield issue. Accordingly, counting the numbers of particles in sampled fluid can be used as a benchmark of the quality of fluid.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B illustrates a schematic back view of a particle detector, according to some embodiments of the present disclosure.

DETAILED DESCRIPTION

Figure 1A:
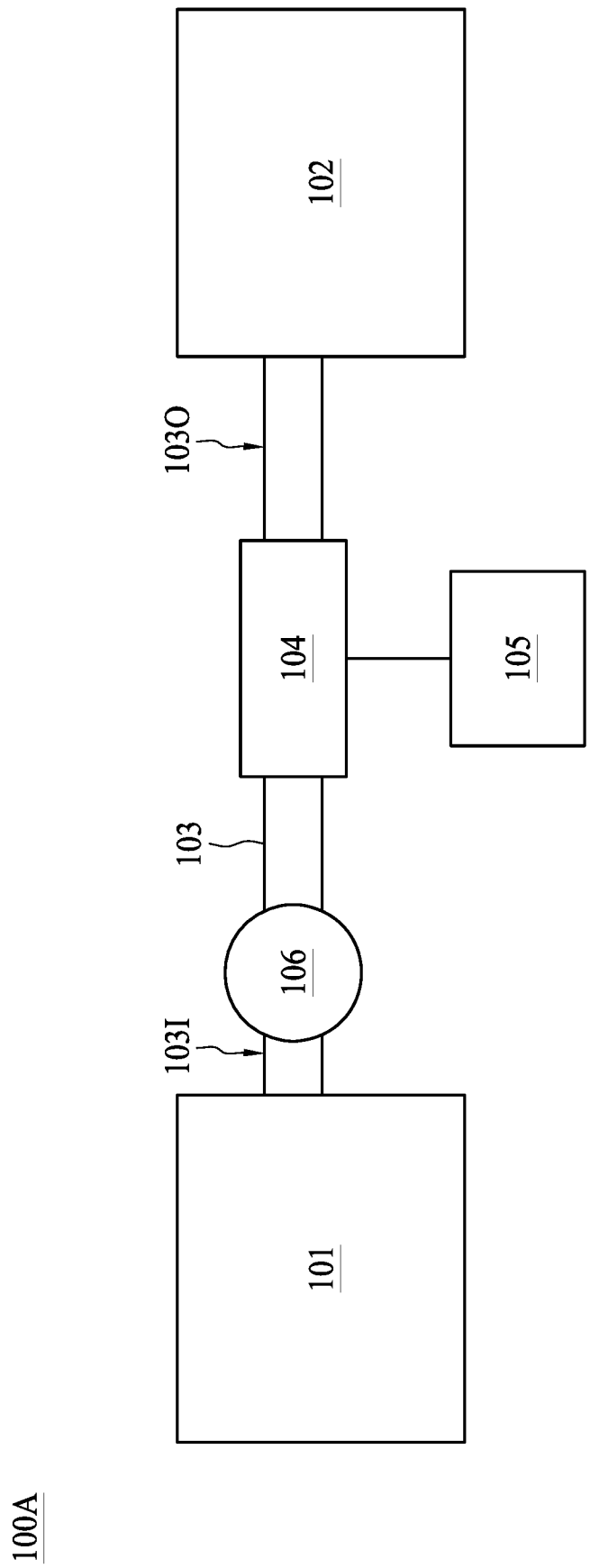
FIG. 1A is a schematic drawing illustrating a fluid sensor system, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Particles, such as nanoparticles distributed in fluid may alter characteristics of fluid. The particles or the nanoparticles may be unwanted and such nanoparticle contamination can result in electrical, yield and device performance degradation. A detector for obtaining the characteristics of chemical liquid or for detecting the nanoparticles distributed in fluid is therefore needed. Nanoparticle detectors are therefore developed. The term "nanoparticles" refers to atomic, molecular or macromolecular particles typically in the length scale of approximately 1 to 100 nanometer range. Typically, the novel and differentiating properties and functions of nanoparticles are observed or developed at a critical length scale of matter typically under 100 nm.

In some comparative approaches, the nanoparticle detectors can only be used to detect for high-density nanoparticles. In some instances, the term "high-density" refers to an amount greater than approximately 1000 per cubic centimeter, or in some case, greater than 10,000 per cubic centimeter. However, it has been found that such nanoparticle detector suffers from failure when the nanoparticle density is less than 1,000 per cubic centimeter, or in some case, less than 10,000 per cubic centimeter. In some comparative approaches, the detector can be a laser photo detector (UDI). However, UDI suffered from low efficiency when detecting particles having a size equal to or less than 20 nm.

Furthermore, in some comparative approaches, the nanoparticle detector can only be used to detect non-corrosive or low corrosive chemical. Such nanoparticle detectors may be damaged and may not be reliable for detecting nanoparticles, especially when the nanoparticle density is relatively lower.

The present disclosure provides a fluid sensor system and a particle detector, as well as the method for using the fluid sensor system to address aforementioned issues. For example, the reliability of the particle detector in a highly corrosive chemical can be improved.

Referring to FIG. 1A, FIG. 1A is a schematic drawing illustrating a fluid sensor system, according to some embodiments of the present disclosure. A fluid sensor system 100A at least include a fluid supply source 101 and a conduit 103, wherein the conduit 103 has an inlet 1031 proximal to the fluid supply source 101 and an outlet 1030 distal to the fluid supply source 101. The fluid sensor system 100A further include a detector 104 configured to monitor the quality of fluid supplied from fluid supply source 101. In some embodiments, the detector 104 is installed in the conduit 103. In some embodiments, in order to stabilize fluid pressure in the conduit 103, a flow rate regulator 106 may be disposed at an upstream of on the conduit 103, and the detector 104 is disposed at a downstream from the flow rate regulator 106. In some embodiments, the outlet 1030 of the conduit 103 is connected to a process module 102, which may include processing chamber (such as cleaning chamber, etching chamber, thermal chamber, oxidation chamber, or the like) that includes a fluid dispenser. In some embodiments, the fluid supply source 101 supplies a type of fluid that can be utilized in an operation performed in the process module 102. In some alternative embodiments, the outlet 1030 of the conduit 103 is connected to a fluid drain or a fluid container.

In some of the embodiments, the fluid supplied from the fluid supply source 101 may be corrosive, such as hydrochloric acid (HCl), sulfuric acid ($H_2SO_4$), nitric acid ($HNO_3$), hydrofluoric acid (HF), phosphoric acid ($H_3PO_4$), tetramethylammonium hydroxide (TMAH), or other types of strong acids, strong alkalis, corrosive solution, or corrosive gas. In some alternative embodiments, particles in other corrosive or non-corrosive types of fluid (including water, solution, liquid, gas, supercritical fluid, or combination thereof) can also be detected by the detector 104.

The fluid sensor system 100A may further include a determination circuit 105 electrically connected to the detector 104. When the fluid is introduced and delivered in the conduit 103, nanoparticles contained in the fluid may be detected and/or counted by the detector 104, and detection signal and/or counting signal may be generated. In some embodiments, the determination circuit 105 may include a current meter (such as Am-meter). In some alternative embodiments, the determination circuit 105 may include one or more of voltage meter (such as Volt-meter), current meter, resistor meter (such as Ohm-meter), capacitance meter, multi-meter, or the like.

Figure 1B:
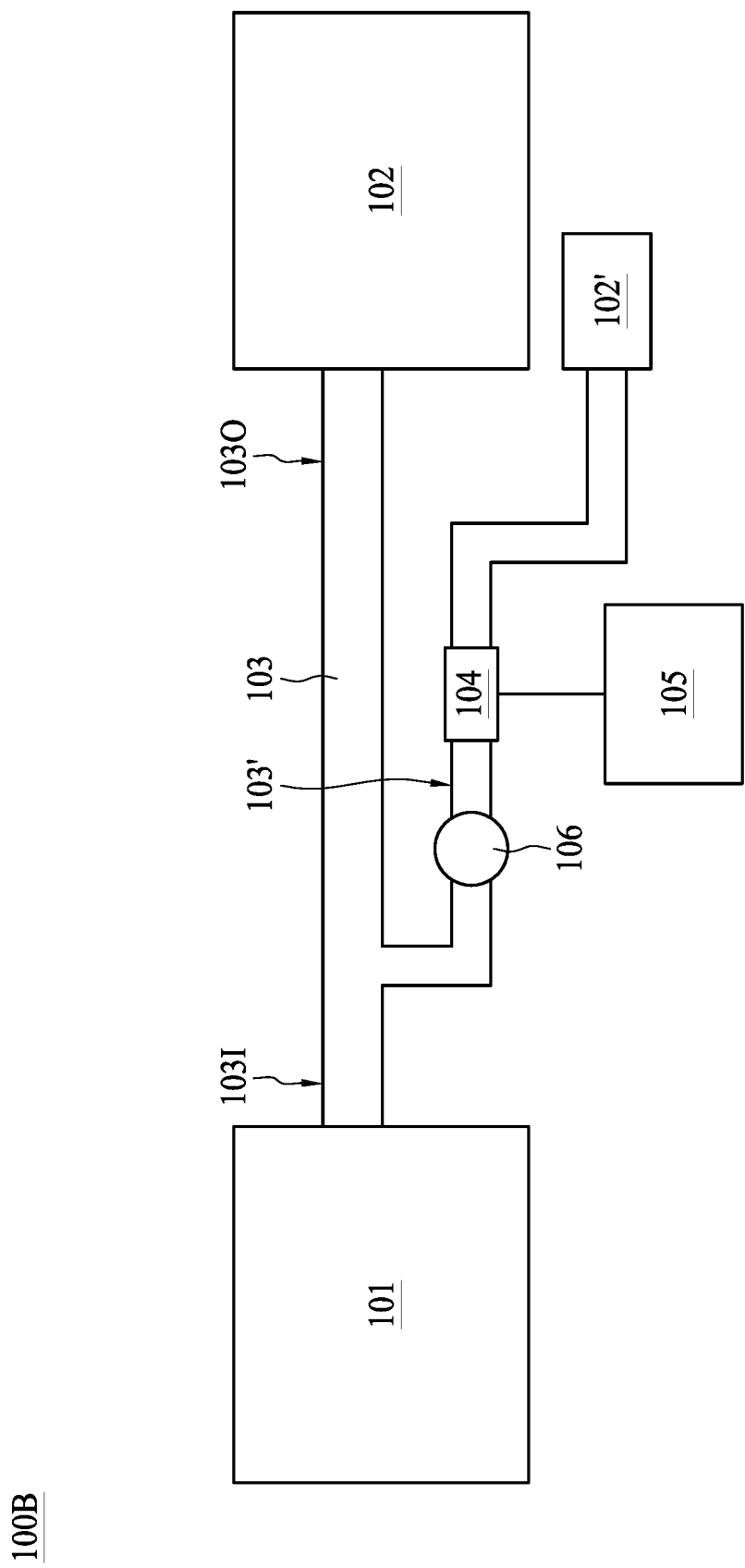
FIG. 1B is a schematic drawing illustrating a fluid sensor system, according to some embodiments of the present disclosure.

Referring to FIG. 1B, FIG. 1B is a schematic drawing illustrating a fluid sensor system, according to some embodiments of the present disclosure. The fluid sensor system 100B may be similar to the fluid sensor system 100A discussed in FIG. 1A. The main difference resides in that the fluid sensor system 100B further include a sampling pipe 103' connected to the conduit 103, and a portion of the fluid from the conduit 103 is guided to the sampling pipe 103' in order to perform detection over the sampled portion of fluid. Furthermore, the detector 104 of the fluid sensor system 100B is installed in the sampling pipe 103'. In some embodiments, in order to stabilize fluid pressure in the sampling pipe 103', a flow rate regulator 106 may be disposed at an upstream of the sampling pipe 103', and the detector 104 is disposed at a downstream from the flow rate regulator 106. In some alternative embodiments, an outlet of the sampling pipe 103' is connected to a fluid drain 102' or a fluid container.

The fluid sensor system 100B may further include a determination circuit 105 electrically connected to the detector 104. When the fluid is introduced and delivered in the sampling pipe 103', nanoparticles contained in the sampled fluid may be detected and/or counted by the detector 104, and detection signal and/or counting signal may be generated. In some embodiments, the determination circuit 105 may include a current meter (such as Am-meter). In some alternative embodiments, the determination circuit 105 may include one or more of voltage meter (such as Volt-meter), current meter, resistor meter (such as Ohm-meter), capacitance meter, multi-meter, or the like.

Figure 2A:
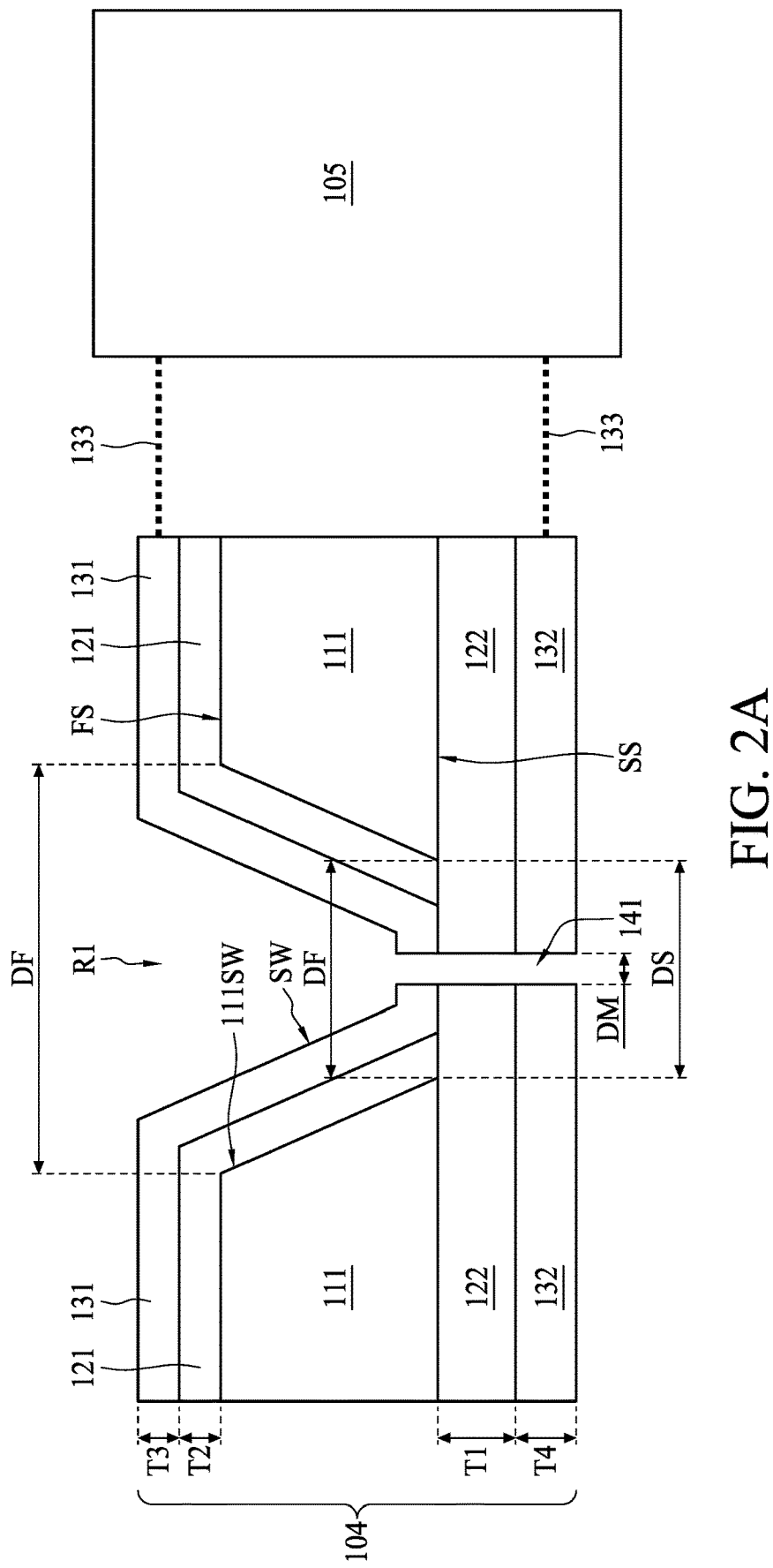
FIG. 2A illustrates a cross-sectional view of a particle detector, according to some embodiments of the present disclosure.
Figure 2B:
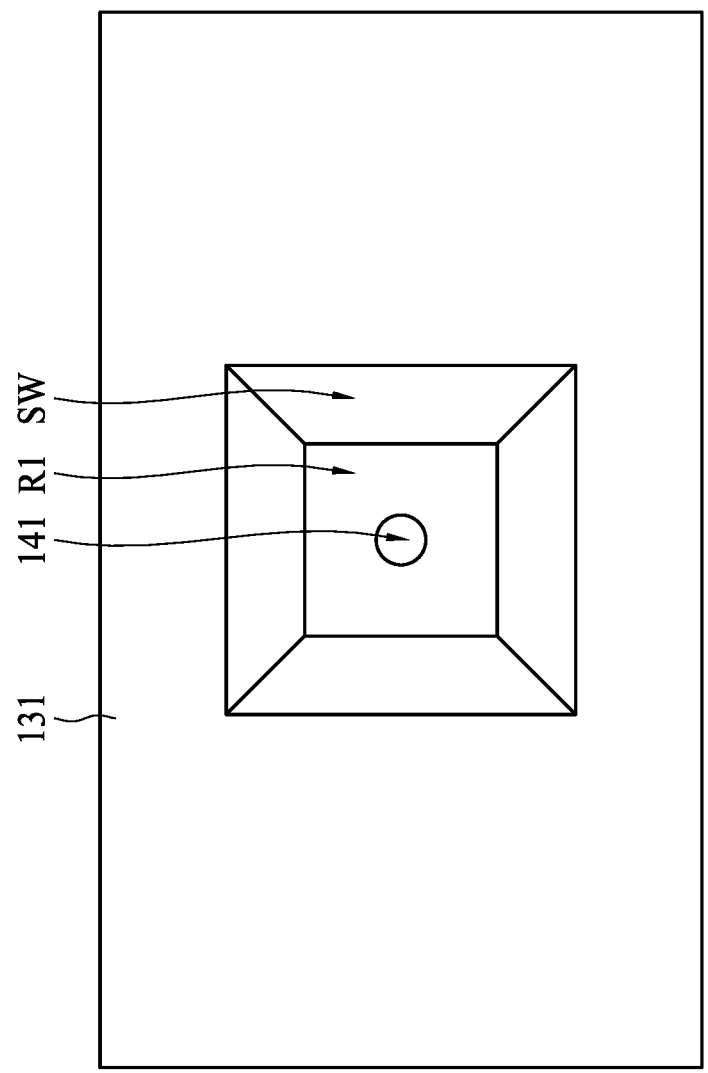
FIG. 2B illustrates a schematic top view of a particle detector, according to some embodiments of the present disclosure.

Referring to FIG. 2A and FIG. 2B, FIG. 2A illustrates a cross-sectional view of a particle detector, FIG. 2B illustrates a schematic top view of a particle detector of FIG. 2A, according to some embodiments of the present disclosure. The detector 104 at least include a substrate 111, herein the substrate 111 has a first surface FS and a second surface SS opposite to the first surface FS. The substrate 111 includes a first material. In some embodiments, the first material may be silicon, but the present disclosure is not limited thereto. The substrate 111 may include a recess R1 recessed from the first surface FS, which may have a funnel-shape in some cases. As shown in FIG. 2B, the recess R1 can have a quadrangle or rectangular configuration in top view, but the disclosure is not limited thereto. In some alternative embodiments, the recess R1 can have a circular shape or other suitable configurations in top view. In some embodiments, the recess R1 may penetrate the substrate 111, wherein a dimension DF of the recess R1 at the first surface FS may be greater than a dimension DS of the recess R1 at the second surface SS.

The detector 104 further includes a protection layer 121 over the first surface FS of the substrate 111. The protection layer 121 further conforms to the sidewalls 111SW of the substrate 111. The protection layer 121 may include a second material different from the first material of the substrate 111. In some of the embodiments, the second material may be an anti-corrosive material, for example, a removal rate of the first material under the fluid is greater than a removal rate of the second material under the fluid. The fluid may be hydrochloric acid (HCl), sulfuric acid ($H_2SO_4$), phosphoric acid ($H_3PO_4$), nitric acid ($HNO_3$), hydrofluoric acid (HF), tetramethylammonium hydroxide (TMAH), or other types of strong acids, strong alkalis, corrosive solution, or corrosive gas. In some embodiments, the second material may be silicon carbide (SiC), or the like. In some comparative embodiments, silicon may be damaged by certain types of corrosive chemicals, such as TMAH; and $Si_3N_4$ may be damaged by certain types of corrosive chemicals, such as HF.

The detector 104 further includes a membrane 122 over the second surface SS of the substrate 111. In some embodiments, a material of the membrane 122 may be anti-corrosive. For example, the material of the membrane 122 may be identical to the second material of the protection layer 121, such as silicon carbide (SiC), or the like. In some embodiments, a portion of the membrane 122 is free from being under a coverage of a vertical projection area of the substrate 111. In some embodiments, the first surface FS (as well as the sidewalls 111SW) and the second surface SS of the substrate 111 are protected by the protection layer 121 and the membrane 122, thereby are free from being exposed to the fluid. In some of the embodiments, the membrane 122 and the protection layer 121 may be in direct contact at a peripheral area of the recess R1 proximal to the second surface SS. The protection layer 121 and membrane 122 are collectively referred to as chemical-protection layer of the detector 104, which may alleviate the damage to the substrate 111 due to the fluid.

In some embodiments, the dimension DS of the recess R1 at the second surface SS may be in a range from about 30 μm to about 300 μm. If the dimension DS of the recess R1 is less than the aforementioned range, it may be difficult to form a through via 141 (which would be discussed in FIG. 18A to FIG. 18C); if the dimension DS of the recess R1 is greater than the aforementioned range, the total area of the membrane 122 overhanging the recess R1 on the second surface SS of the substrate 111 may become larger, thereby have a smaller bearable maximum fluid pressure. In some embodiments, a thickness T2 of the protection layer 121 may be in a range from about 50 nm to about 500 nm. If the thickness T2 of the protection layer 121 is less than the aforementioned range, the reliability of protection layer 121 in terms of anti-corrosive may be reduced; if the thickness T2 of the protection layer 121 is greater than the aforementioned range, the size/profile of the recess R1 may be less than desired, wherein the size/profile of the recess R1 is related to maximum applicable fluid pressure and/or a property of the fluid. In some embodiments, a thickness T1 of the membrane 122 may be in a range from about 50 nm to about 500 nm. If the thickness T1 of the membrane 122 is less than the aforementioned range, the reliability of the membrane 122 in terms of anti-corrosive may be reduced; if the thickness T1 of the membrane 122 is greater than the aforementioned range, the formation of the through via 141 (which would be discussed in FIG. 18A to FIG. 18C) may become difficult.

A first conductive layer 131 is disposed over the protection layer 121. In some embodiments, the first conductive layer 131 is blanket-deposited over the protection layer 121 and conform to a profile of the recess R1. In some of the embodiments, the first conductive layer 131 may be in direct contact with the membrane 122. In some embodiments, a material of the first conductive layer 131 is conductive. In some embodiments, the material of the first conductive layer 131 is material suitable for being used as anti-corrosive layer against strong acid, for example, gold (Au), platinum (Pt), or the like. In some embodiments, a thickness T3 of the first conductive layer 131 may be in a range from about 20 nm to about 200 nm. If the thickness T3 of the first conductive layer 131 is less than the aforementioned range, the reliability of the first conductive layer 131 in terms of anti-corrosive may be reduced; if the thickness T3 of the first conductive layer 131 is greater than the aforementioned range, the formation of the through via 141 (which would be discussed in FIG. 18A to FIG. 18C) may become difficult.

A second conductive layer 132 is formed over the membrane 122. In some embodiments, the second conductive layer 132 is patterned, thus a portion of the membrane 122 may be exposed from the second conductive layer 132. In some embodiments, a material of the second conductive layer 132 is conductive. In some embodiments, the material of the second conductive layer 132 is material suitable for being used as anti-corrosive layer against strong acid, for example, gold (Au), platinum (Pt), or the like. In some embodiments, a thickness T4 of the second conductive layer 132 may be in a range from about 20 nm to about 200 nm. If the thickness T4 of the second conductive layer 132 is less than the aforementioned range, the reliability of the second conductive layer 132 in terms of anti-corrosive may be reduced; if the thickness T4 of the second conductive layer 132 is greater than the aforementioned range, the formation of the through via 141 (which would be discussed in FIG. 18A to FIG. 18C) may become difficult.

The detector 104 further include a through via 141 penetrating the first conductive layer 131, the membrane 122, and the second conductive layer 132. In some embodiments, the through via 141 can be nanopore, which may have a diameter DM in a range from about 100 nm to about 400 nm (or, radius in a range from about 50 nm to about 200 nm). If the diameter DM is less than the aforementioned range, the particles in the fluid may not be able to pass through the through via 141, or, in some cases, the noise of detection may be too large. If the diameter DM is larger than the aforementioned range, the sensitivity of detection may be less than desired. In some embodiments, the size of the through via 141 may be designed based on possible sizes of particles in fluid. When it is necessary to detect smaller particles, the diameter DM of through via 141 may be designed in a smaller fashion to boost sensitivity. In some embodiments, the through via 141 may be formed by focus ion beam (FIB), thus the material of the first conductive layer 131, the membrane 122, and the second conductive layer 132 (which are penetrated by the through via 141) may be anti-corrosive to certain chemical and can be configured with a nanopore by using focus ion beam, while having a strong reliability (such as adequate rigidity thus can bear adequate fluid pressure and overhang over the recess R1 on the second surface SS of the substrate 111).

Figure 3A:
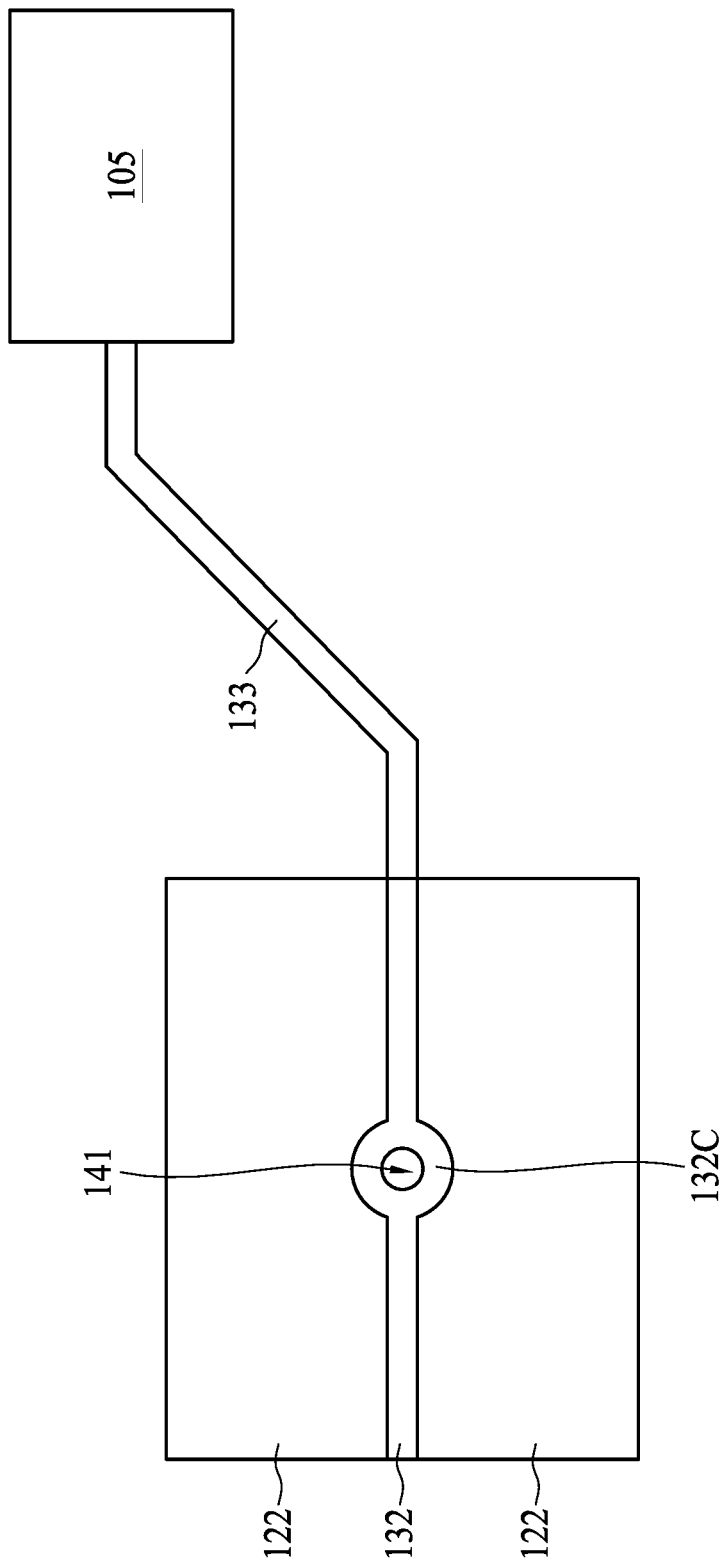
FIG. 3A illustrates a schematic back view of a particle detector, according to some embodiments of the present disclosure.
Figure 3C:
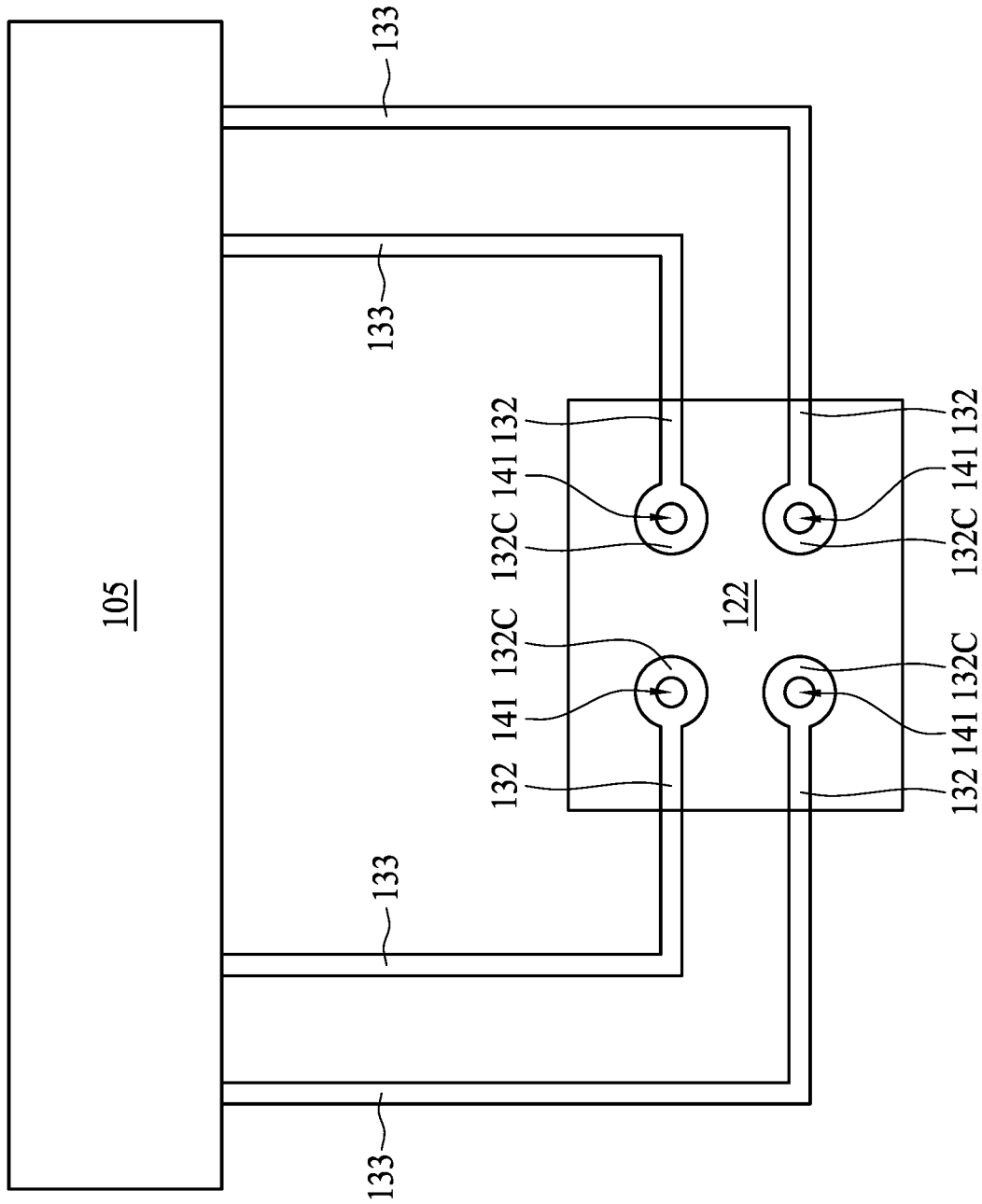
FIG. 3C illustrates a schematic back view of a particle detector, according to some embodiments of the present disclosure.

Referring to FIG. 3A, FIG. 3A illustrates a schematic back view of a particle detector, according to some embodiments of the present disclosure. FIG. 3A illustrates an embodiment of the detector 104 having one through via 141 (or nanopore). In some of the embodiments, the second conductive layer 132 may include a circular portion 132C laterally surrounding an opening of the through via 141 from bottom view. Referring to FIG. 3B and FIG. 3C, FIG. 3B illustrates a schematic back view of a particle detector, FIG. 3C illustrates a schematic back view of a particle detector, according to some embodiments of the present disclosure. FIG. 3B and FIG. 3C respectively illustrates embodiments of the detector 104 having two and four through vias 141 (or nanopore). For example, a total amount of through vias 141 configured on the detector 104 may be in a range from 1 to about 100. The amount of through vias 141 configured on the detector 104 may be determined based on targeted sampling rate.

Referring to FIG. 2A to FIG. 3C and FIG. 4A to FIG. 4C, FIG. 4A to FIG. 4C are diagrams illustrating detection results according to aspects of the present disclosure. The first conductive layer 131 and the second conductive layer 132 are electrically connected to the determination circuit 105 through conductive paths 133, thereby constituting a detection circuit. In some embodiments, the determination circuit 105 may include a current meter (such as Am-meter). In some alternative embodiments, the determination circuit 105 may include one or more of voltage meter (such as Volt-meter), current meter, resistor meter (such as Ohm-meter), capacitance meter (wherein the first conductive layer 131 and the second conductive layer 132 can be utilized as electrodes), multi-meter, or the like. In some of the embodiments, the first conductive layer 131 can serve as a common ground.

In some embodiments, when the fluid to be sampled is liquid or solution, the determination circuit 105 can include current meter (or multi-meter, or the like), which can detect the variation of current. When particles contained in the fluid pass through the through vias 141 of the detector 104, current variation may be detected. Through the detected current variation, the amount of particles having a size in a determined range, or greater than a threshold value (for example, particles greater than 19 nm are detected), may be essentially identified or counted.

Figure 4A:
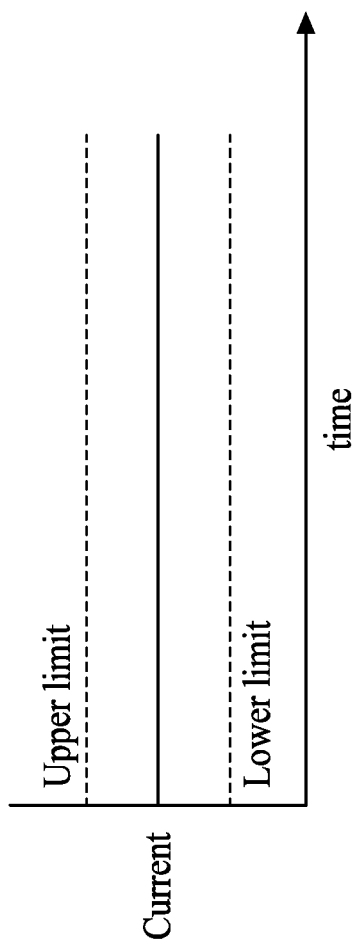
FIG. 4A to FIG. 4C are diagrams illustrating detection results according to aspects of the present disclosure.

As shown in FIG. 4A, when the magnitude of current is stable and remain between the predetermined upper limit and the predetermined lower limit, it may be concluded that the fluid is normal (substantially free from particles having a size in a determined range, or greater than a threshold value; or, low contamination) based on sampling result.

Figure 4B:
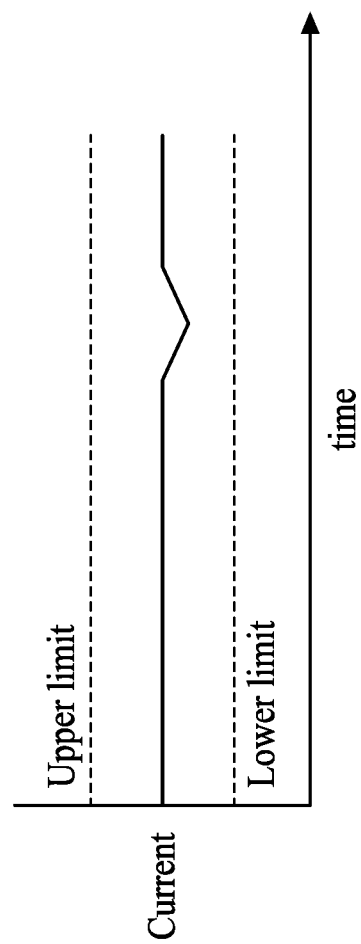

As shown in FIG. 4B, small fluctuations may occur, but when the magnitude of current stays between the predetermined upper limit and the predetermined lower limit, it may be concluded that the detected particles may be smaller than determined range or a threshold value, thus may not substantially affect the overall quality of the fluid. Or, in some other cases, the small fluctuations may be triggered by sampling deviation or mild environmental factors.

Figure 4C:
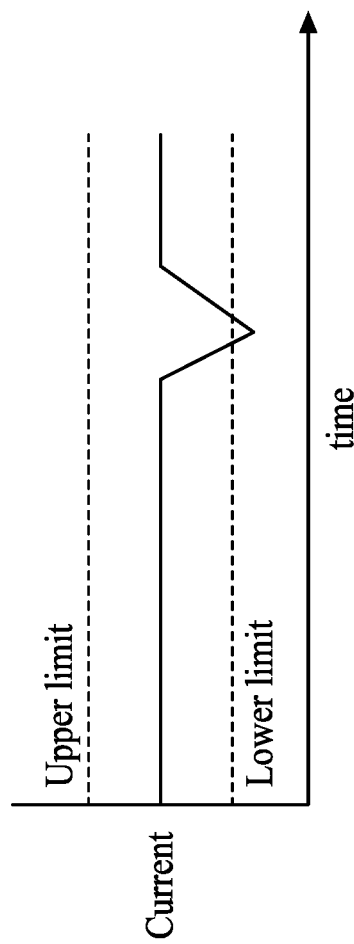

As shown in FIG. 4C, when the magnitude of current spikes above the predetermined upper limit or dropped below the predetermined lower limit, it may be concluded that the detected particle has a size in a determined range, or greater than a threshold value. Such particles may be unwanted and can result in electrical, yield and device performance degradation, or contamination.

Total amount of detected particles having a size in a determined range (or greater than a threshold value) can be counted after performing the detection for a period of time. For example, it can be conducted by adding up the numbers of times when the magnitude of current spikes above the predetermined upper limit or dropped below the predetermined lower limit among every through vias 141 of the detector 104.

In some alternative embodiments, when the fluid to be sampled is gaseous, the particles contained in the fluid passing through the through vias 141 of the detector 104 may trigger capacitance variation. Through the detected capacitance variation, the amount of particles having a size in a determined range, or greater than a threshold value (for example, particles greater than 19 nm are detected), may be essentially identified. The method of determining amount of certain particles within certain period of time is similar to the current variation detection as discussed above, but the difference resides in that the determination circuit 105 may include capacitance meter in order to detect capacitance variation.

In some embodiments, the first surface FS of the substrate 111 is relatively proximal to the fluid supply source 101 (i.e. at upstream of the fluid flow) and the second surface SS of the substrate 111 is relatively distal to the fluid supply source 101 (i.e. at downstream of the fluid flow) during the particle detection operation. In some alternative embodiments, the second surface SS of the substrate 111 is relatively proximal to the fluid supply source 101 (i.e. at upstream of the fluid flow) and the first surface FS of the substrate 111 is relatively distal to the fluid supply source 101 (i.e. at downstream of the fluid flow) during the particle detection operation. The configuration of which side of the detector 104 is at the upstream may be determined based on the type of fluid and the properties thereof. In some of the embodiments, the detector 104 may be replaceable or exchangeable. In some of the alternative embodiments, the detector 104 may be fixed.

Figure 5:
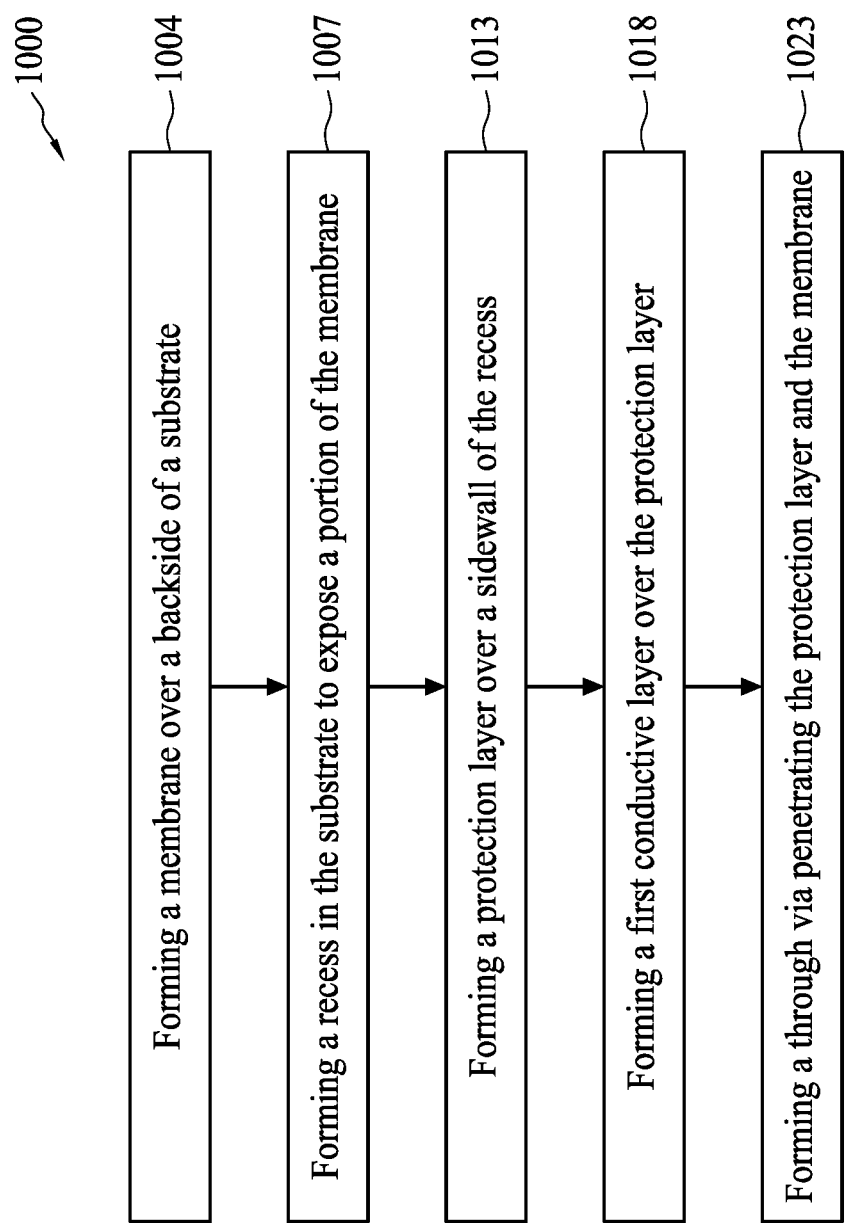
FIG. 5 shows a flow chart of a method for fabricating a detector, in accordance with some embodiments of the present disclosure.

Referring to FIG. 5, FIG. 5 shows a flow chart of a method for fabricating a detector, in accordance with some embodiments of the present disclosure. The method 1000 for fabricating a semiconductor device includes forming a membrane over a backside of a substrate (operation 1004, see, for example, FIG. 6), forming a recess in the substrate to expose a portion of the membrane (operation 1007, see, for example, FIG. 7 to FIG. 9), forming a protection layer over a sidewall of the recess (operation 1013, see, for example, FIG. 13), forming a first conductive layer over the protection layer (operation 1018, see, for example, FIG. 17A and FIG. 17B), and forming a through via penetrating the protection layer and the membrane (operation 1023, see, for example, FIG. 18A to FIG. 18C).

Figure 6:
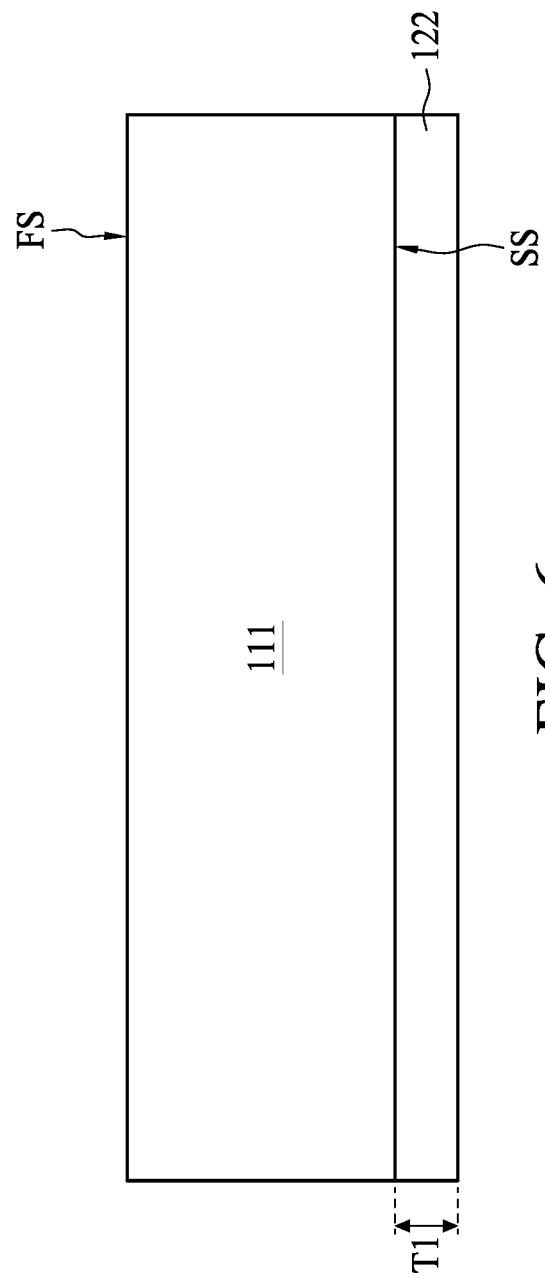
FIG. 6 to FIG. 9 are cross sectional views of a particle detector during intermediate stages of manufacturing operations, according to some embodiments of the present disclosure.

Referring to FIG. 6, FIG. 6 is a cross sectional view of a particle detector during intermediate stages of manufacturing operations, according to some embodiments of the present disclosure. A substrate 111 including a first material is provided. In some embodiments, the first material can be silicon, or the like. The substrate 111 has a first surface FS and a second surface SS opposite to the first surface FS. A membrane 122 including a second material is formed over the second surface SS of the substrate 111. The second material is different from the first material. As previously discussed in FIG. 2A to FIG. 2B, for example, the second material can be silicon carbide (SiC), or the like. In some embodiments, a thickness T1 of the membrane 122 may be in a range from about 50 nm to about 500 nm. If the thickness T1 of the membrane 122 is less than the aforementioned range, the reliability of the membrane 122 in terms of anti-corrosive may be reduced; if the thickness T1 of the membrane 122 is greater than the aforementioned range, the formation of the through via 141 (which would be discussed in FIG. 18A to FIG. 18C) may become difficult.

Figure 7:
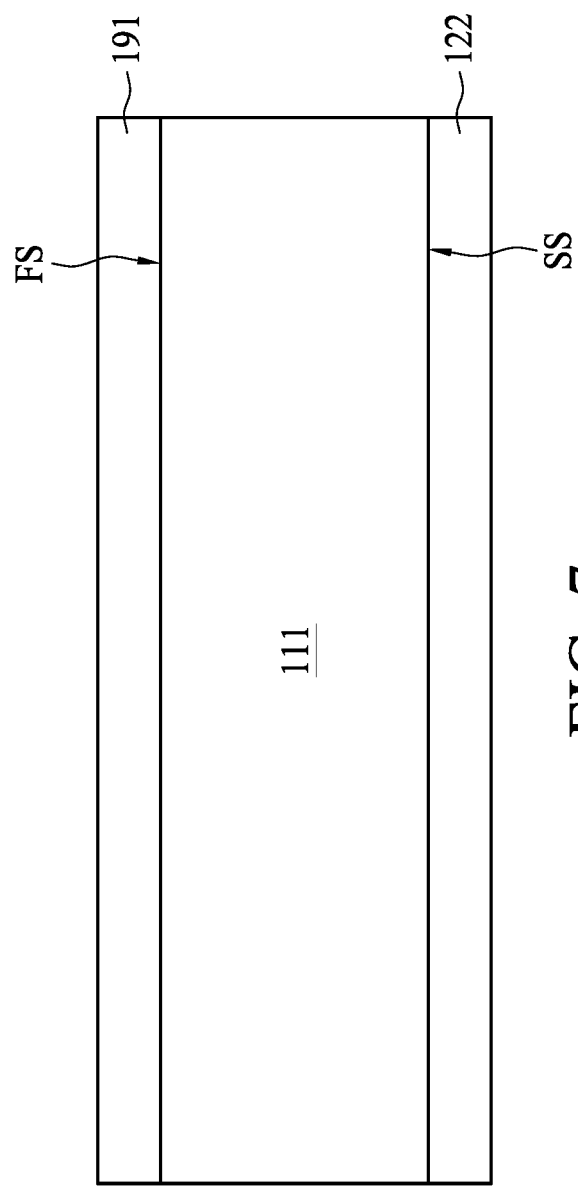
Figure 8:
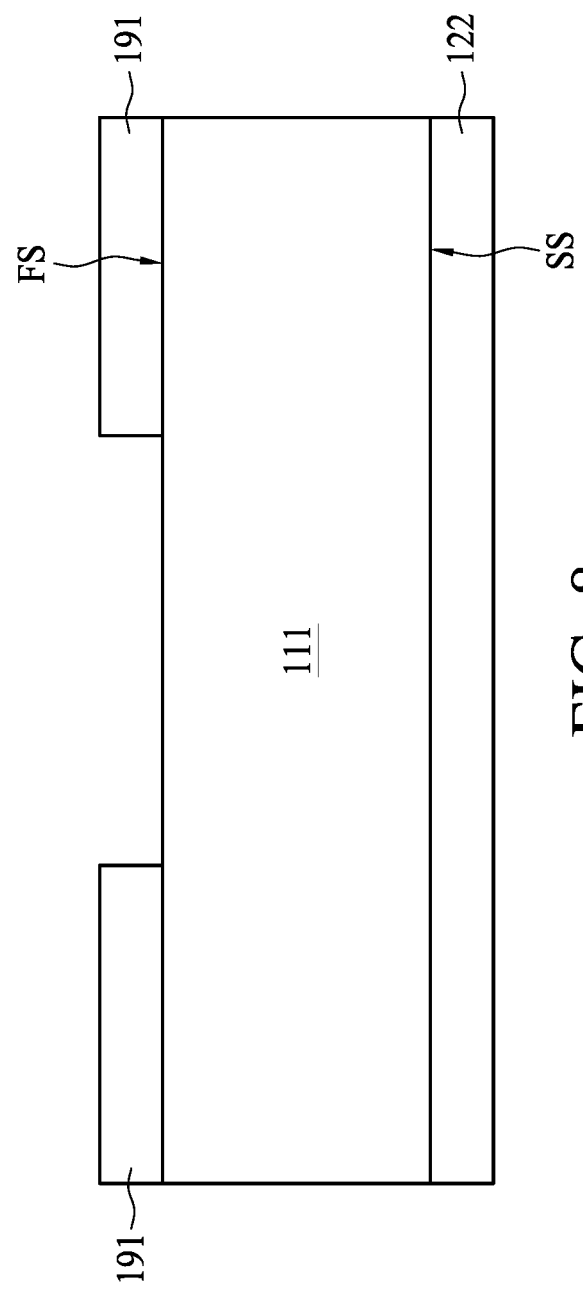

Referring to FIG. 7, FIG. 7 is a cross sectional view of a particle detector during intermediate stages of manufacturing operations, according to some embodiments of the present disclosure. A first photoresist layer 191 is formed over the first surface FS of the substrate 111. Referring to FIG. 8, FIG. 8 is a cross sectional view of a particle detector during intermediate stages of manufacturing operations, according to some embodiments of the present disclosure. By utilizing the photolithography technique (such as exposure and developing), the first photoresist layer 191 can be patterned, and a portion of the first surface FS of the substrate 111 may be exposed.

Figure 9:
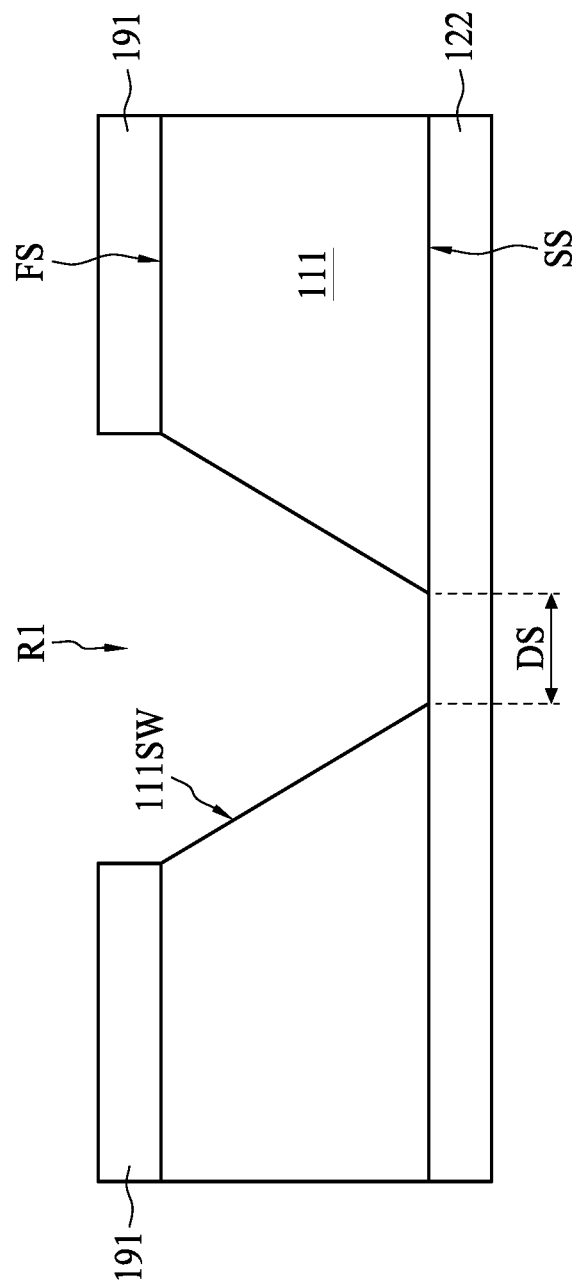

Referring to FIG. 9, FIG. 9 is a cross sectional view of a particle detector during intermediate stages of manufacturing operations, according to some embodiments of the present disclosure. A recess R1 recessed from the first surface FS is formed by etching operation. For example, the etching operation may be wet etching, which may include applying TMAH over the exposed portion of the first surface FS of the substrate 111, thus a portion of the substrate 111 is removed. In some embodiments, a portion of the membrane 122 may be exposed from the substrate 111 after the etching operation. As discussed above, the membrane 122 may include an anti-corrosive material, thus can be utilized as an etch stop layer for such etching operation. In some embodiment, the recess R1 may have a funnel-shape and have four sidewalls 111SW. As previously discussed in FIG. 2B, the recess R1 can have a quadrangle or rectangular configuration in top view, but the disclosure is not limited thereto. In some alternative embodiments, the recess R1 can have a circular shape or other suitable configurations in top view. (The details of the recess R1 can be referred to FIG. 2A to FIG. 2B.) In some embodiments, the dimension DS of the recess R1 at the second surface SS may be in a range from about 30 μm to about 300 μm. If the dimension DS of the recess R1 is less than the aforementioned range, it may be difficult to form a through via 141 (which would be discussed in FIG. 18A to FIG. 18C); if the dimension DS of the recess R1 is greater than the aforementioned range, the total area of the membrane 122 overhanging the recess R1 on the second surface SS of the substrate 111 may become larger, thereby have a smaller bearable maximum fluid pressure.

Figure 10A:
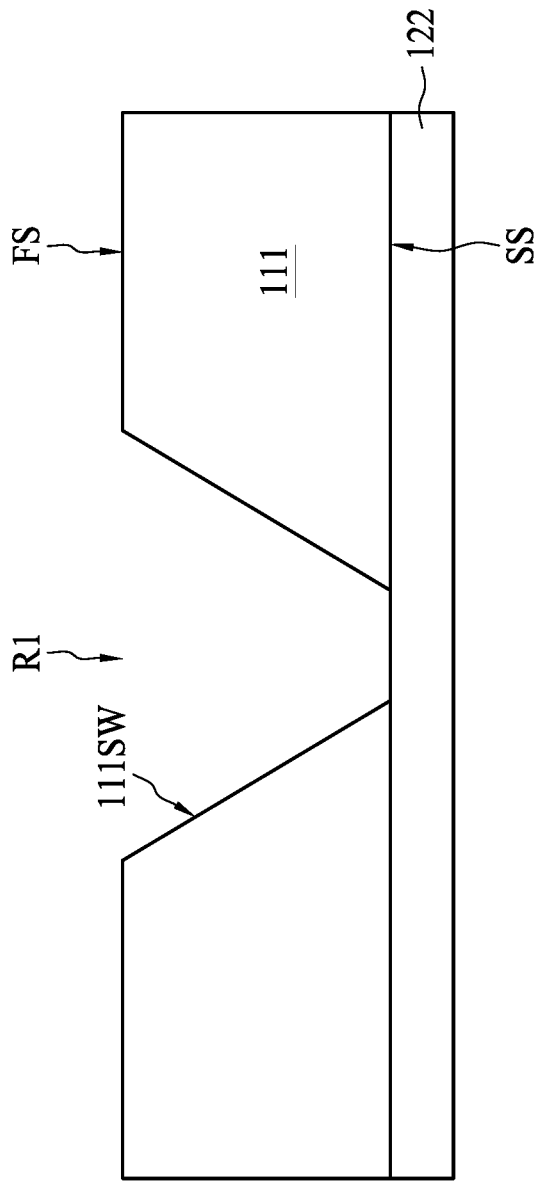
FIG. 10A is a cross sectional view of a particle detector during intermediate stages of manufacturing operations, according to some embodiments of the present disclosure.
Figure 10B:
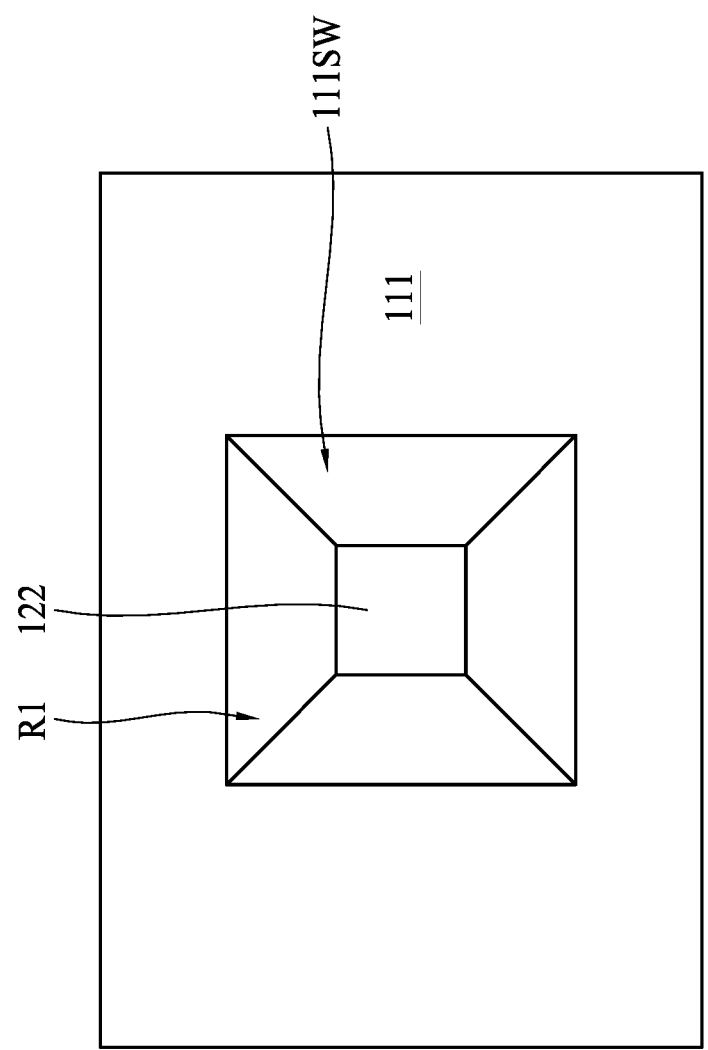
FIG. 10B is a schematic top view of a particle detector during intermediate stages of manufacturing operations discussed in FIG. 10A, according to some embodiments of the present disclosure.

Referring to FIG. 10A and FIG. 10B, FIG. 10A is a cross sectional view of a particle detector during intermediate stages of manufacturing operations, FIG. 10B is a schematic top view of a particle detector during intermediate stages of manufacturing operations discussed in FIG. 10A, according to some embodiments of the present disclosure. The first photoresist layer 191 can be removed. In some embodiments, the first surface FS of the substrate 111 is thereby exposed.

Figure 11:
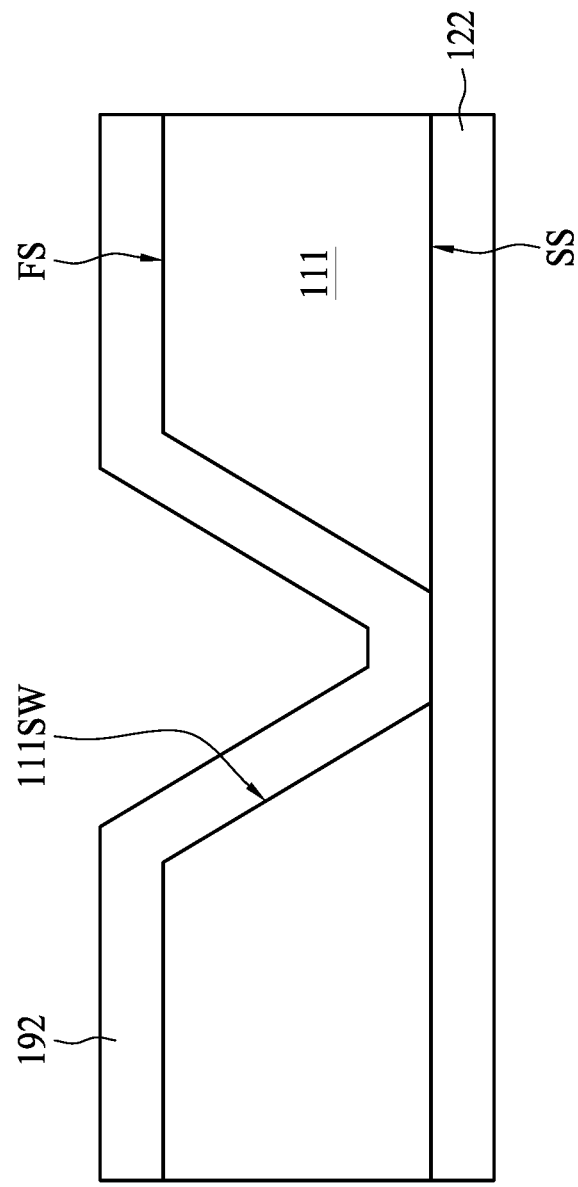
FIG. 11 to FIG. 13 are cross sectional views of a particle detector during intermediate stages of manufacturing operations, according to some embodiments of the present disclosure.

Referring to FIG. 11, FIG. 11 is a cross sectional view of a particle detector during intermediate stages of manufacturing operations, according to some embodiments of the present disclosure. A second photoresist layer 192 is formed over the first surface FS of the substrate 111, the sidewalls 111SW of the recess R1, and the exposed surface of the membrane 122 (which may be proximal to the second surface of the substrate 111). In some embodiments, the second photoresist layer 192 may conform to a profile of the first surface FS of the substrate 111, the sidewalls 111SW of the recess R1, and the exposed surface of the membrane 122. In some embodiments, the second photoresist layer 192 may be formed by spin coating, that is, the substrate 111 is rotated during the formation of the second photoresist layer 192.

Figure 12:
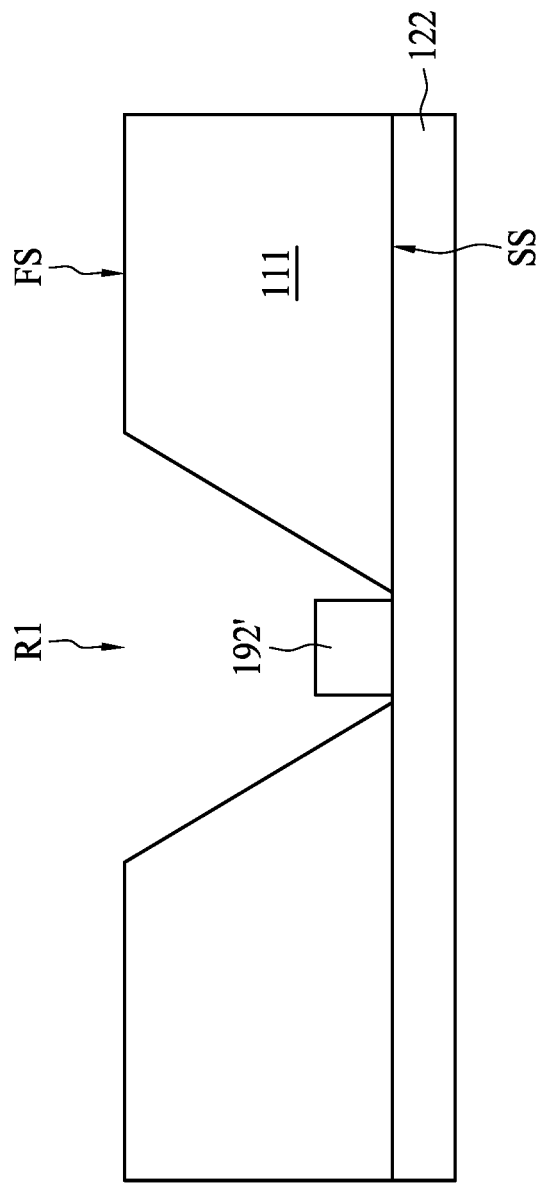

Referring to FIG. 12, FIG. 12 is a cross sectional view of a particle detector during intermediate stages of manufacturing operations, according to some embodiments of the present disclosure. The second photoresist layer 192 may be partially removed. For example, portions of the second photoresist layer 192 over the first surface FS of the substrate 111 and the sidewalls 111SW of the recess R1 are removed (such as by lithography operations, including exposure and/or developing), and a portion 192' of the second photoresist layer 192 over the exposed surface of the membrane 122 is remained. Thereby the first surface FS of the substrate 111 and the sidewalls 111SW of the recess R1 are exposed, and at least a portion of the membrane 122 proximal to the substrate 111 is remained covered. In some of the embodiments, the corners at the bottoms of the sidewalls 111SW of the recess R1 may be exposed from the portion 192' of the second photoresist layer 192. In some alternative embodiments, the portion 192' of the second photoresist layer 192 may be proximal to or in contact with the corners at the bottoms of the sidewalls 111SW of the recess R1.

Figure 13:
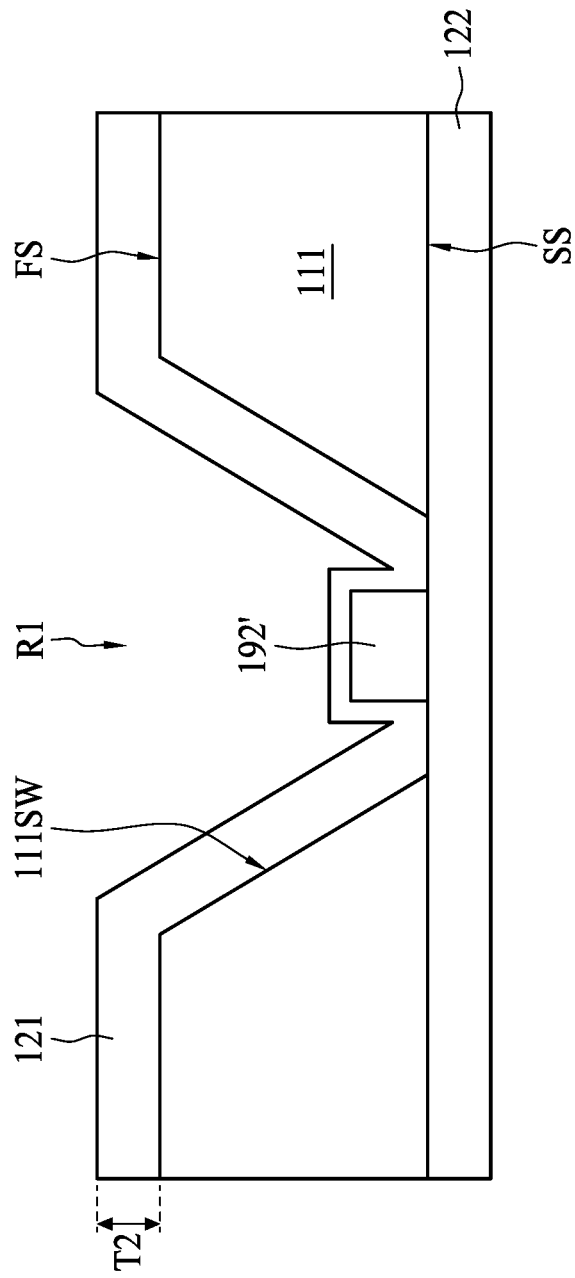

Referring to FIG. 13, FIG. 13 is a cross sectional view of a particle detector during intermediate stages of manufacturing operations, according to some embodiments of the present disclosure. A protection layer 121 is formed over the first surface FS of the substrate 111 and the sidewalls 111SW of the recess R1. In some embodiments, the protection layer 121 conforms to the profile of the first surface FS of the substrate 111 and the sidewalls 111SW of the recess R1. In some embodiments, the protection layer 121 may be anti-corrosive. For example, the protection layer 121 may include aforementioned second material different from the first material, such as silicon carbide (SiC), or the like. In some embodiments, the protection layer 121 may be formed by chemical vapor deposition (CVD), physical vapor deposition (PVD), or the like. In some embodiments, the formation of portion 192' of the second photoresist layer 192 over the membrane 122 can help obstructing the formation of the protection layer 121 over an area of the membrane 122 to be formed with through via(s) 141 (such as center area, but the present disclosure is not limited thereto), which would have cause the membrane 122 becoming thicker and increasing the difficulty of forming the through via 141 (which would be discussed in FIG. 18A to FIG. 18C). In some of the embodiments, the protection layer 121 may be formed over the exposed surfaces of the portion 192' of the second photoresist layer 192.

In the embodiments of the corners at the bottoms of the sidewalls 111SW of the recess R1 being exposed from the portion 192' of the second photoresist layer 192 in the operation discussed in FIG. 12, the protection layer 121 may be formed over such corners. Thereby, the first surface FS, the sidewalls 111SW, and the second surface SS of the substrate 111 are protected by the protection layer 121 and the membrane 122, thereby are free from being exposed. In some of the embodiments, the membrane 122 may be in direct contact with the protection layer 121 at a peripheral area of the recess R1 proximal to the portion of the sidewalls 111SW proximal to the second surface SS.

In some embodiments, a thickness T2 of the protection layer 121 may be in a range from about 50 nm to about 500 nm. If the thickness T2 of the protection layer 121 is less than the aforementioned range, the reliability of protection layer 121 in terms of anti-corrosive may be reduced; if the thickness T2 of the protection layer 121 is greater than the aforementioned range, the size/profile of the recess R1 may be less than desired, wherein the size/profile of the recess R1 is related to maximum applicable fluid pressure and/or a property of the fluid.

Figure 14A:
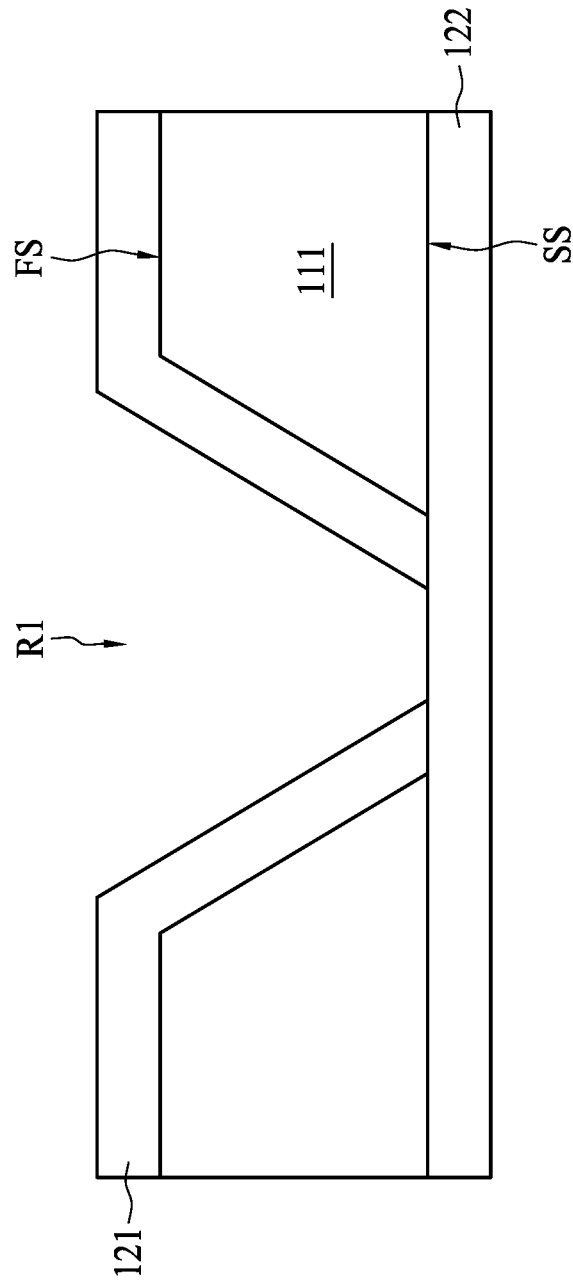
FIG. 14A is a cross sectional view of a particle detector during intermediate stages of manufacturing operations, according to some embodiments of the present disclosure.
Figure 14B:
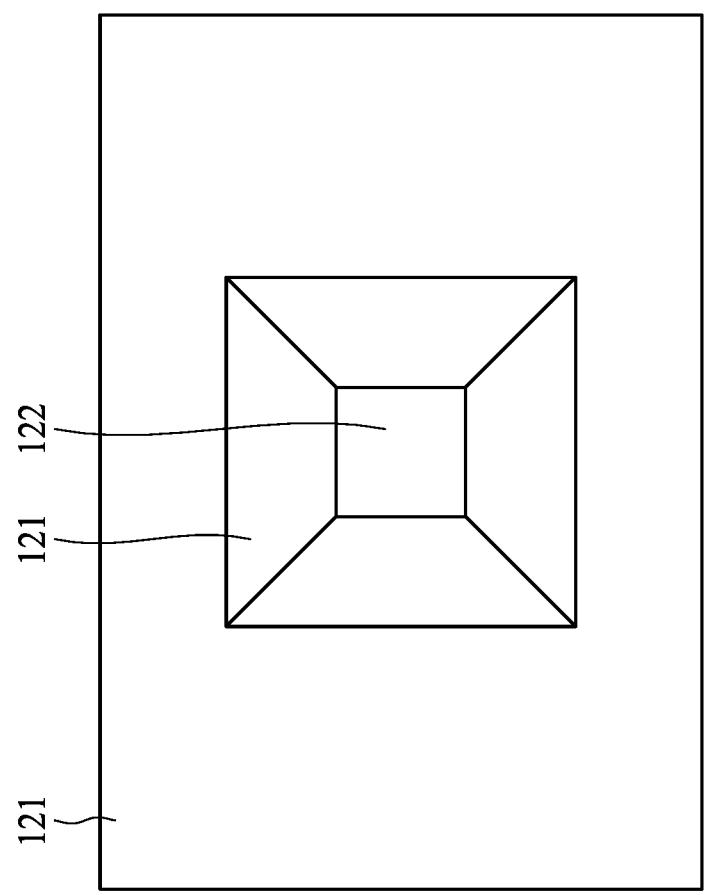
FIG. 14B is a schematic top view of a particle detector during intermediate stages of manufacturing operations discussed in FIG. 14A, according to some embodiments of the present disclosure.

Referring to FIG. 14A and FIG. 14B, FIG. 14A is a cross sectional view of a particle detector during intermediate stages of manufacturing operations, FIG. 14B is a schematic top view of a particle detector during intermediate stages of manufacturing operations discussed in FIG. 14A, according to some embodiments of the present disclosure. The remaining portion 192' of the second photoresist layer 192 is removed to expose the membrane 122. In some of the embodiments, a portion of the protection layer 121 over the exposed surfaces of the portion 192' of the second photoresist layer 192 is also removed.

Figure 15A:
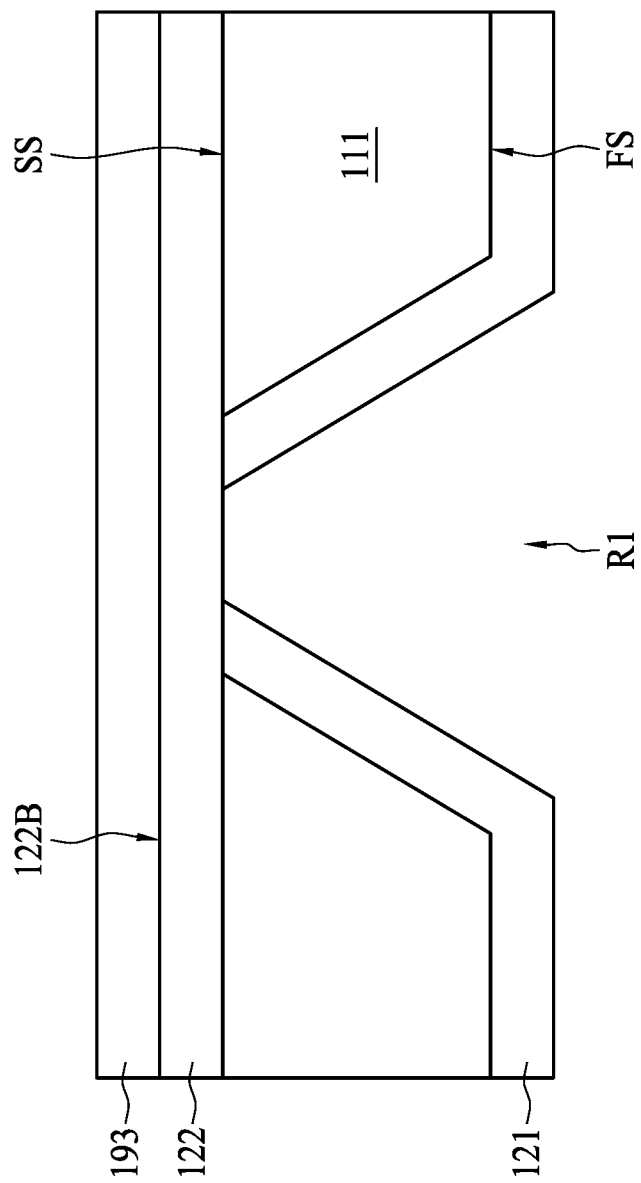
FIG. 15A is a cross sectional view of a particle detector during intermediate stages of manufacturing operations, according to some embodiments of the present disclosure.
Figure 15B:
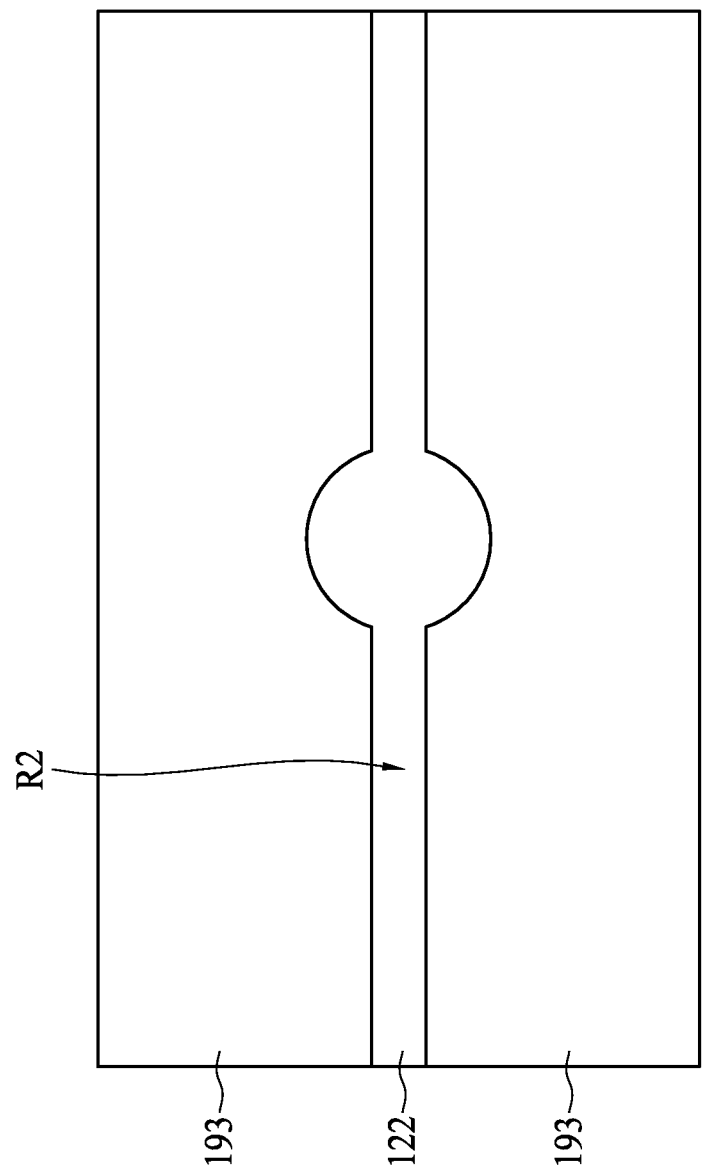
FIG. 15B is a schematic back view of a particle detector during intermediate stages of manufacturing operations discussed in FIG. 15A, according to some embodiments of the present disclosure.

Referring to FIG. 15A and FIG. 15B, FIG. 15A is a cross sectional view of a particle detector during intermediate stages of manufacturing operations, FIG. 15B is a schematic back view of a particle detector during intermediate stages of manufacturing operations discussed in FIG. 15A, according to some embodiments of the present disclosure. A third photoresist layer 193 is formed over the surface 122B of the membrane 122, wherein the surface 122B is facing away from the substrate 111. In some embodiments, the third photoresist layer 193 may be patterned to form a patterned recess R2 which exposes a portion of the surface 122B of the membrane 122.

Figure 16A:
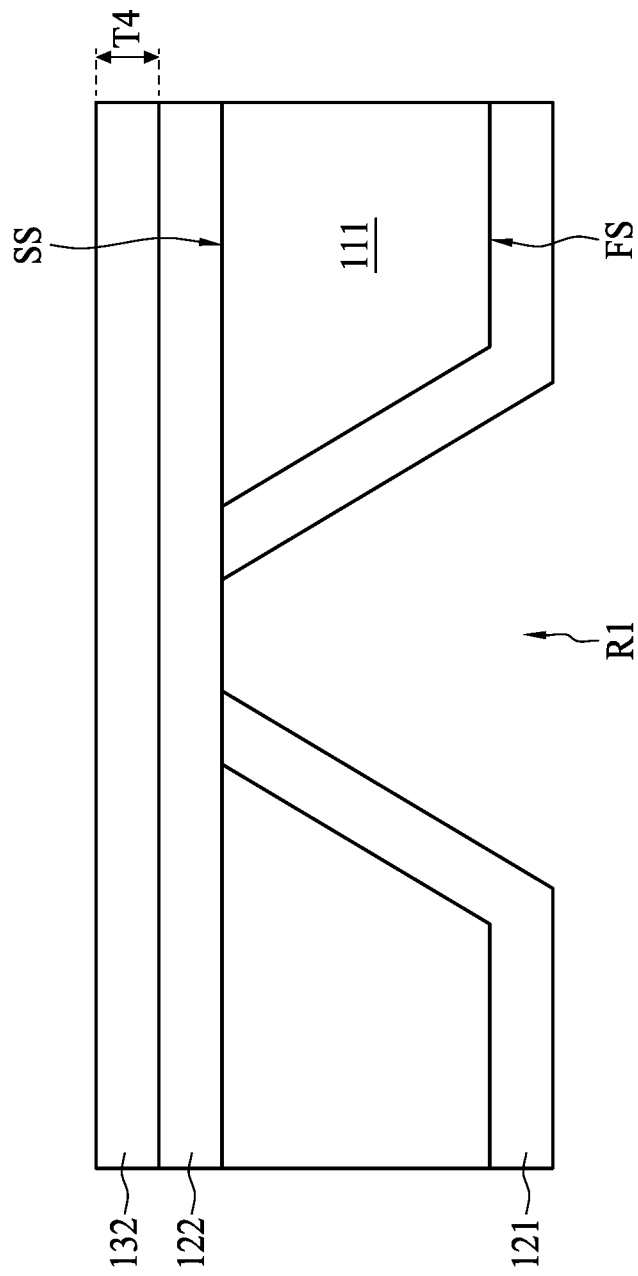
FIG. 16A is a cross sectional view of a particle detector during intermediate stages of manufacturing operations, according to some embodiments of the present disclosure.
Figure 16B:
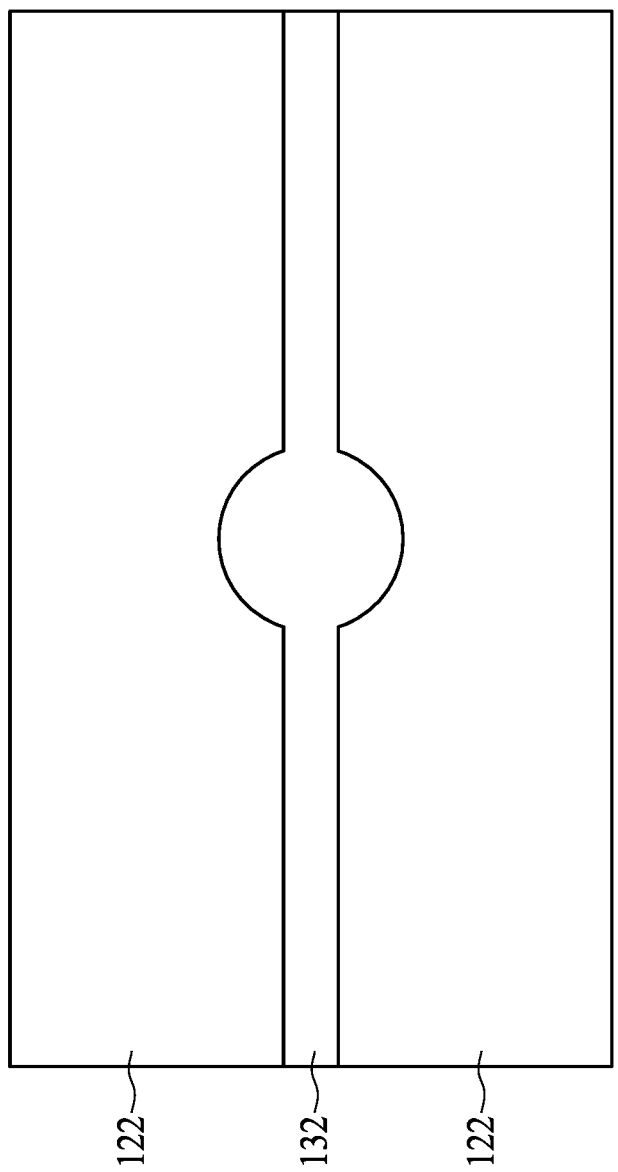
FIG. 16B is a schematic back view of a particle detector during intermediate stages of manufacturing operations discussed in FIG. 16A, according to some embodiments of the present disclosure.

Referring to FIG. 16A and FIG. 16B, FIG. 16A is a cross sectional view of a particle detector during intermediate stages of manufacturing operations, FIG. 16B is a schematic back view of a particle detector during intermediate stages of manufacturing operations discussed in FIG. 16A, according to some embodiments of the present disclosure. The second conductive layer 132 is formed in the patterned recess R2 (shown in FIG. 15B), and the third photoresist layer 193 is subsequently removed. In some embodiments, the material of the second conductive layer 132 is material suitable for being used as anti-corrosive layer against strong acid, for example, gold (Au), platinum (Pt), or the like. In some embodiments, a thickness T4 of the second conductive layer 132 may be in a range from about 20 nm to about 200 nm. If the thickness T4 of the second conductive layer 132 is less than the aforementioned range, the reliability of the second conductive layer 132 in terms of anti-corrosive may be reduced; if the thickness T4 of the second conductive layer 132 is greater than the aforementioned range, the formation of the through via 141 (which would be discussed in FIG. 18A to FIG. 18C) may become difficult.

Figure 17A:
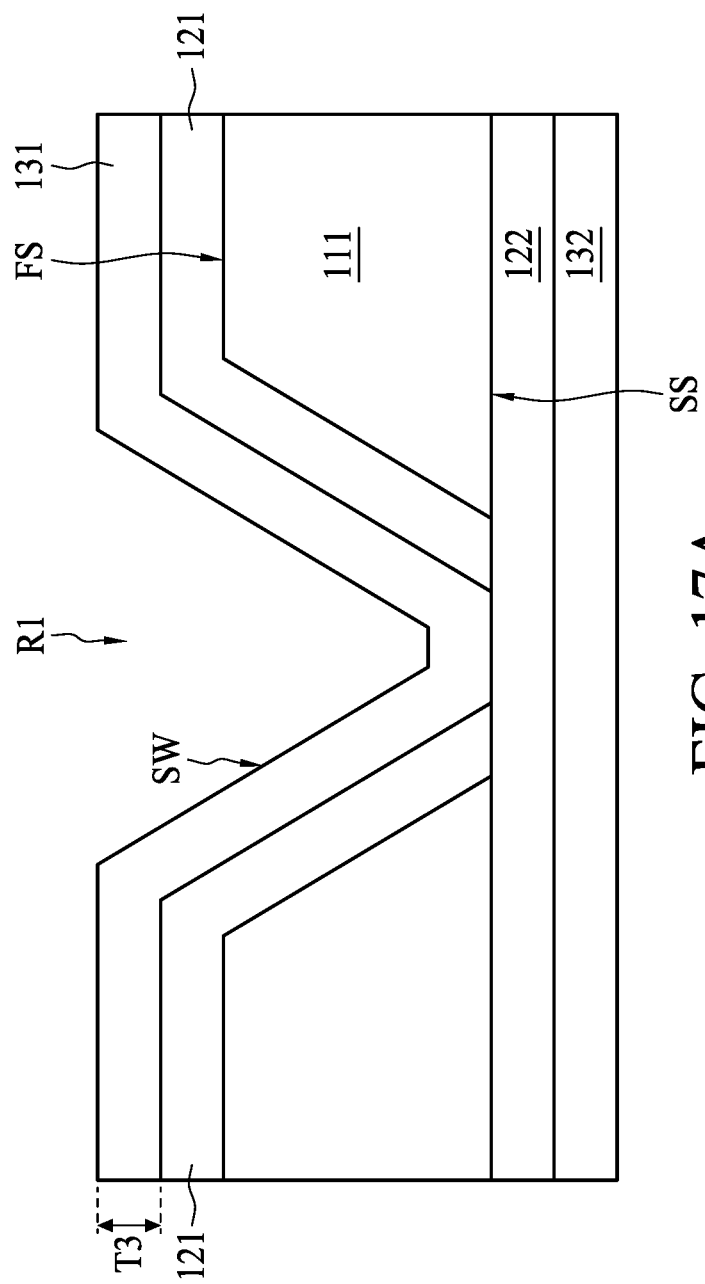
FIG. 17A is a cross sectional view of a particle detector during intermediate stages of manufacturing operations, according to some embodiments of the present disclosure.
Figure 17B:
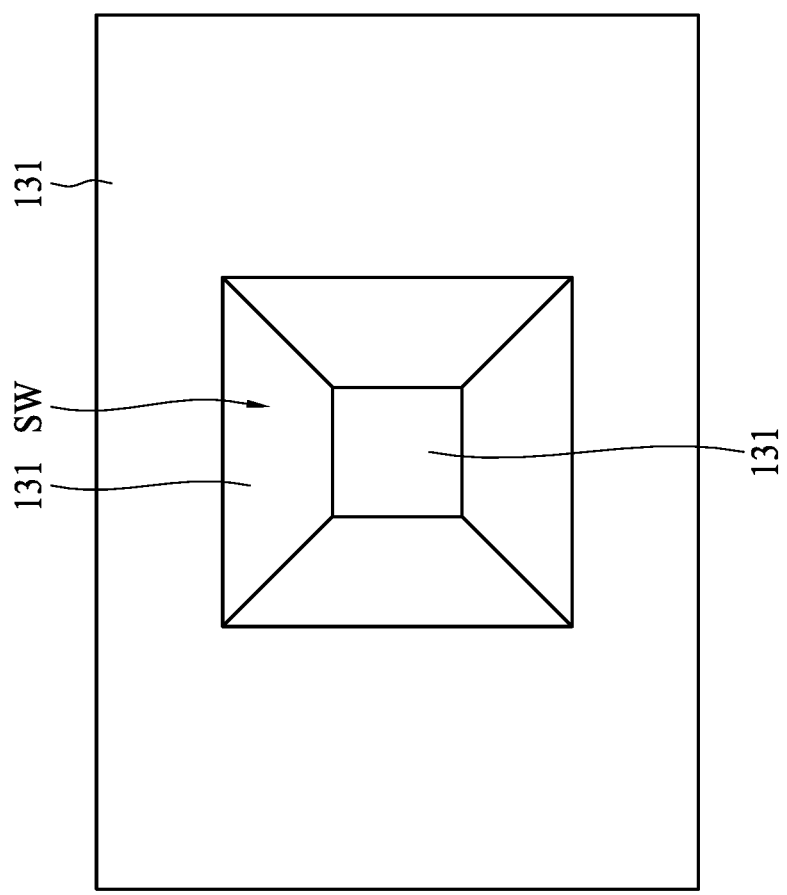
FIG. 17B is a schematic top view of a particle detector during intermediate stages of manufacturing operations discussed in FIG. 17A, according to some embodiments of the present disclosure.

Referring to FIG. 17A and FIG. 17B, FIG. 17A is a cross sectional view of a particle detector during intermediate stages of manufacturing operations, FIG. 17B is a schematic top view of a particle detector during intermediate stages of manufacturing operations discussed in FIG. 17A, according to some embodiments of the present disclosure. A first conductive layer 131 is formed over the protection layer 121 as well as the exposed surface of the membrane 122 (which is proximal to the second surface SS of the substrate 111). In some embodiments, the first conductive layer 131 is blanket-deposited over the protection layer 121 and conform to a profile of the recess R1. In some embodiments, a material of the first conductive layer 131 is conductive. In some embodiments, the material of the first conductive layer 131 is material suitable for being used as anti-corrosive layer against strong acid, for example, gold (Au), platinum (Pt), or the like. In some embodiments, a thickness T3 of the first conductive layer 131 may be in a range from about 20 nm to about 200 nm. If the thickness T3 of the first conductive layer 131 is less than the aforementioned range, the reliability of the first conductive layer 131 in terms of anti-corrosive may be reduced; if the thickness T3 of the first conductive layer 131 is greater than the aforementioned range, the formation of the through via 141 (which would be discussed in FIG. 18A to FIG. 18C) may become difficult. As shown in FIG. 17A to FIG. 17B, the first conductive layer 131 constitutes the sidewalls SW of the recess R1.

Figure 18A:
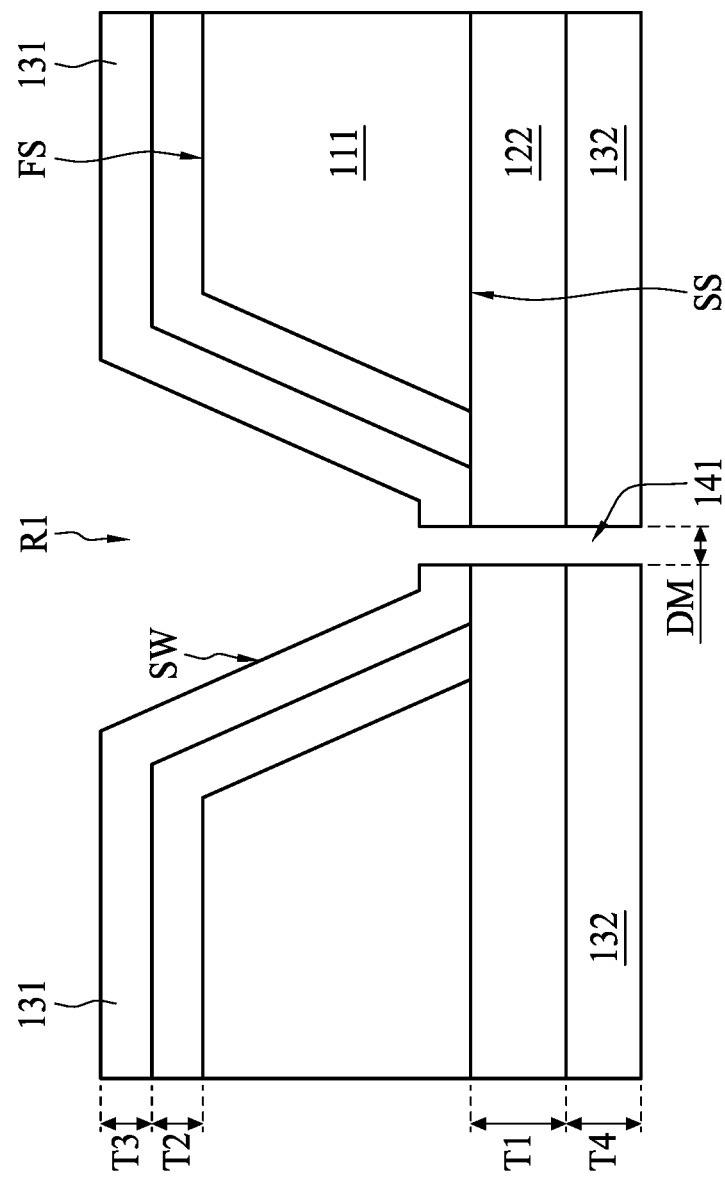
FIG. 18A is a cross sectional view of a particle detector during intermediate stages of manufacturing operations, according to some embodiments of the present disclosure.
Figure 18B:
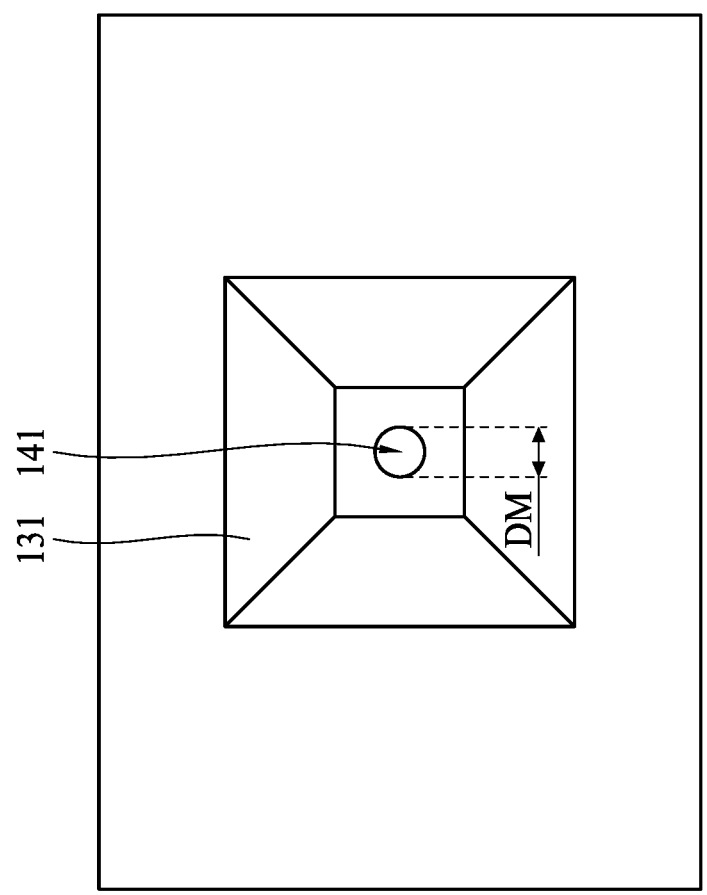
FIG. 18B is a schematic top view of a particle detector during intermediate stages of manufacturing operations discussed in FIG. 18A, according to some embodiments of the present disclosure.
Figure 18C:
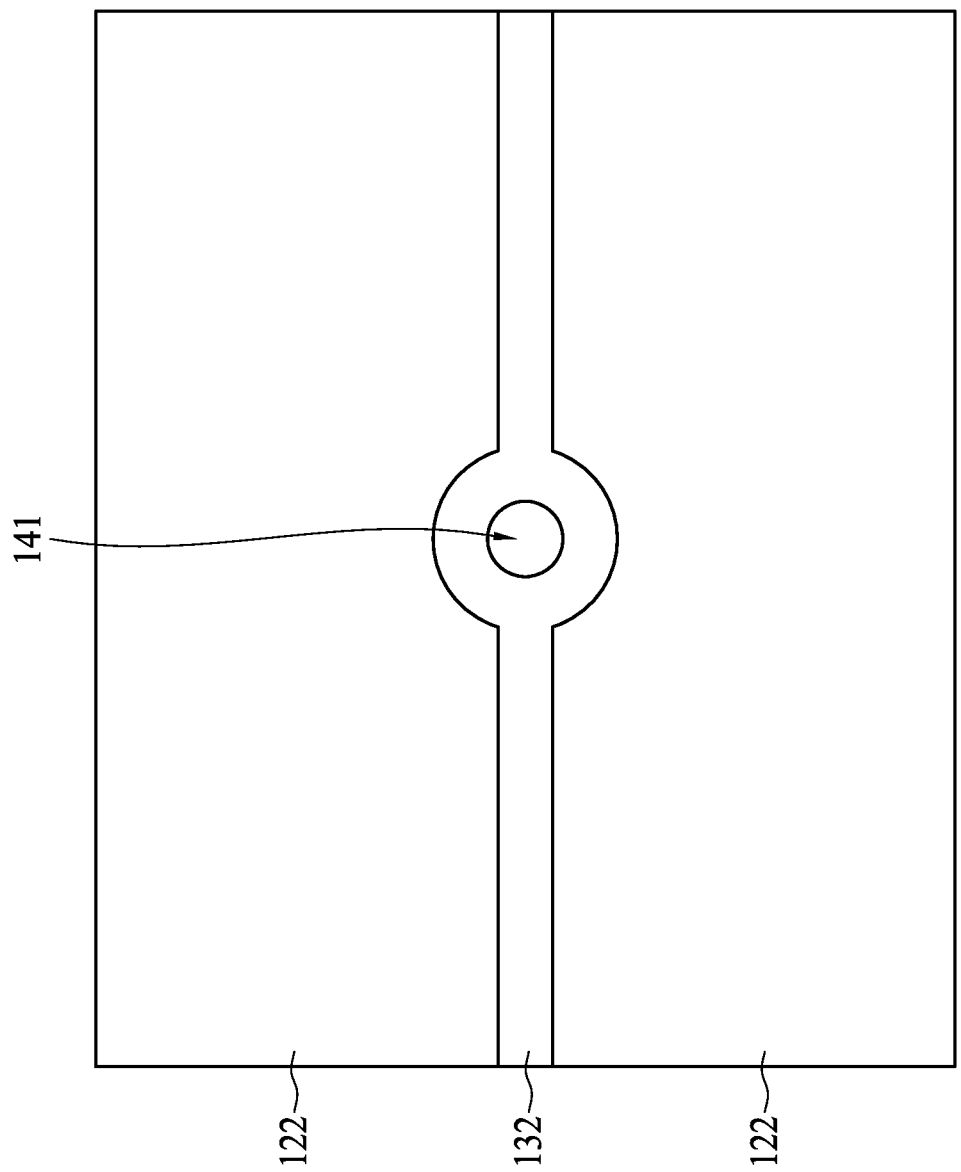
FIG. 18C is a schematic top view of a particle detector during intermediate stages of manufacturing operations discussed in FIG. 18A, according to some embodiments of the present disclosure.

Referring to FIG. 18A to FIG. 18C, FIG. 18A is a cross sectional view of a particle detector during intermediate stages of manufacturing operations, FIG. 18B is a schematic top view of a particle detector during intermediate stages of manufacturing operations discussed in FIG. 18A, FIG. 18C is a schematic top view of a particle detector during intermediate stages of manufacturing operations discussed in FIG. 18A, according to some embodiments of the present disclosure. A through via penetrating the first conductive layer 131, the membrane 122, and the second conductive layer 132 is formed. As previously discussed, the material of the first conductive layer 131, the membrane 122, and the second conductive layer 132 (which are penetrated by the through via 141) may be anti-corrosive to certain chemical and having a strong reliability (such as adequate rigidity). For example, the membrane 122 and the protection layer 121 may be made of silicon carbide (SiC), which has a low etching rate under most types of wet corrosive chemicals and is a hard covalently bonded material with high hardness.

Since the membrane 122 (and the protection layer 121) are configured to protect the substrate 111 from corrosive fluid, it may be difficult to partially remove the material thereof under ordinary wet etching method. Therefore, the through via 141 can be formed by using finely focused tools, such as focus ion beam (FIB) operation which can remove a specific portion of harder materials. In some embodiments, inner sidewalls of the first conductive layer 131, the membrane 122, and the second conductive layer 132 is exposed by the through via 141.

In some embodiments, the through via 141 can be nanopore, which may have a diameter DM in a range from about 100 nm to about 400 nm. If the diameter DM is less than the aforementioned range, the particles in the fluid may not be able to pass through the through via 141, or, in some cases, the noise of detection may be too large. If the diameter DM is larger than the aforementioned range, the sensitivity of detection may be less than desired.

In order to form a through via 141 with adequate reliability and desired diameter, each of the thickness T1 of the membrane 122, thickness T3 of the first conductive layer 131, and thickness T4 of the second conductive layer 132 may be less than certain value. If the thickness T1, T3, and T4 are larger than certain value thereof (as discussed above), it may be difficult to perform FIB operation to form the through via 141. For example, in the embodiments of the membrane 122 includes silicon carbide (SiC), the thickness T1 may be less than 500 nm. It should be noted that the criticality of thickness may vary according to the second material of the membrane 122, the first conductive layer 131 or the second conductive layer 132. As discussed in FIG. 3A to FIG. 3C, the amount of through via 141 may be in a range from 1 to about 100. The amount of through vias 141 may be determined based on targeted sampling rate. If there are more than one through vias 141, the through vias 141 can be arranged in certain manner, for example, in array, in a row, along a curve line, or in predetermined pattern. In some of the embodiments, the plurality of through via 141 may be formed one by one.

Figure 19:
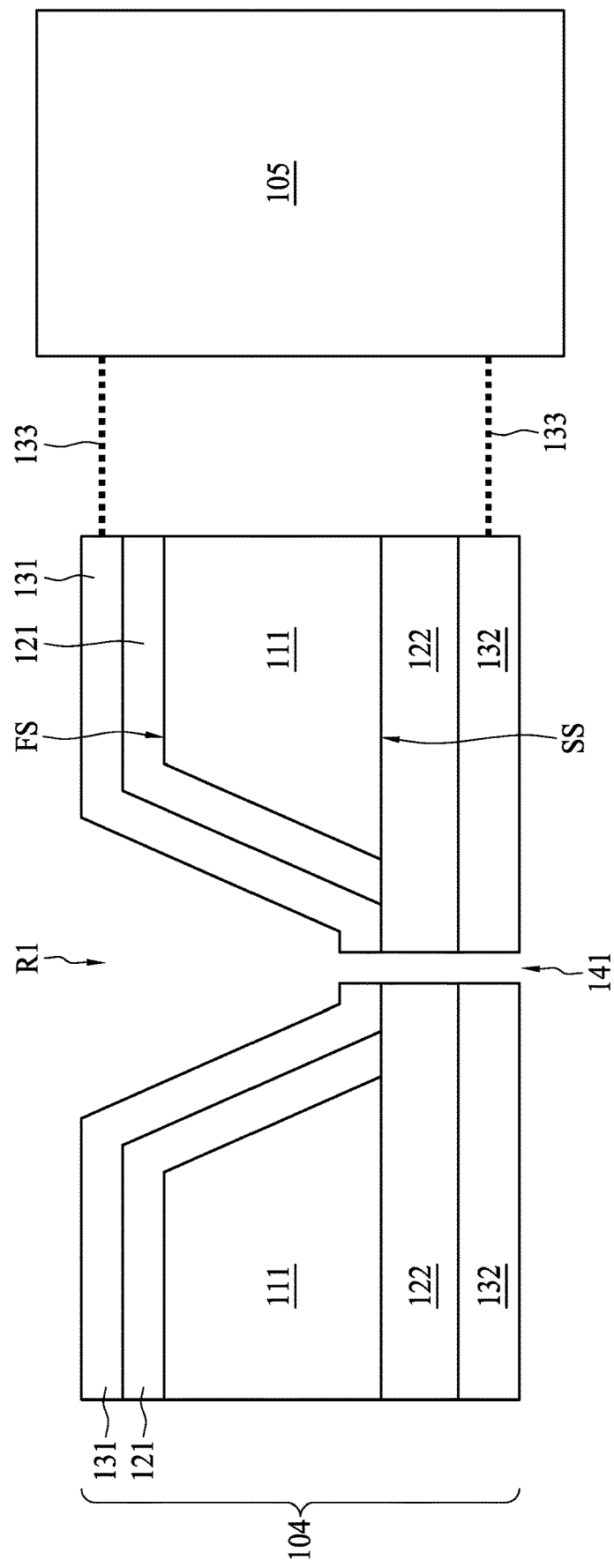
FIG. 19 is a cross sectional view of a particle detector during intermediate stages of manufacturing operations, according to some embodiments of the present disclosure.

Referring to FIG. 19, FIG. 19 is a cross sectional view of a particle detector during intermediate stages of manufacturing operations, according to some embodiments of the present disclosure. The first conductive layer 131 or the second conductive layer 132 are electrically connected to a determination circuit 105 through routing of conductive paths 133, thereby forming a detector 104. In some embodiments, the determination circuit 105 may include a current meter (such as Am-meter). In some alternative embodiments, the determination circuit 105 may include one or more of voltage meter (such as Volt-meter), resistor meter (such as Ohm-meter), capacitance meter (wherein the first conductive layer 131 and the second conductive layer 132 can be utilized as electrodes), multi-meter, or the like. The detector 104 can be installed in the fluid sensor system 100A or 100B as discussed in FIG. 1A to FIG. 1B, wherein the fluid sensor system 100A or 100B with the detector 104 can be utilized as a fluid sensor system for monitoring particles in fluid. For example, the fluid to be tested can be hydrochloric acid (HCl), sulfuric acid ($H_2SO_4$), phosphoric acid ($H_3PO_4$), nitric acid ($HNO_3$), hydrofluoric acid (HF), tetramethylammonium hydroxide (TMAH), or other types of strong acids, strong alkalis, corrosive solution, or corrosive gas. In some alternative embodiments, other corrosive or non-corrosive types of fluid (including water, solution, liquid, gas, supercritical fluid, or combination thereof) can also be detected by the fluid sensor system 100A or 100B.

The fluid sensor system 100A or 100B with aforementioned configuration can be utilized to detect low-density or high-density particles.

The present disclosure provides fluid sensor systems 100A and 100B configured with the detector 104 in order to monitor the quality of tested fluid, especially can be utilized to detect the particles in corrosive fluid. In comparative embodiments, substrates of detectors are often prone to be damaged due to corrosive fluid. By incorporating the protection layer 121 and the membrane 122 with proper material, the protection layer 121 and the membrane 122 may help alleviating the damage to the substrate 111 (which may be made by silicon) by the corrosive fluid. For example, silicon carbide or similar material can be utilized as a material of the protection layer 121 and the membrane 122. Especially, etch rate to silicon carbide under hydrochloric acid (HCl), sulfuric acid ($H_2SO_4$), phosphoric acid ($H_3PO_4$), nitric acid ($HNO_3$), hydrofluoric acid (HF), or tetramethylammonium hydroxide (TMAH) may be substantially lower than an etch rate to silicon under the aforementioned chemicals. Accordingly, detection of particles in those chemicals can be achieved by using silicon carbide as a material of the protection layer 121 and the membrane 122.

However, since silicon carbide (or other anti-corrosive material) has a low etching rate under most types of wet corrosive chemicals and is a hard covalently bonded material with high hardness, forming a through via 141 penetrating silicon carbide layer (or other anti-corrosive material layer) by ordinary wet etching operations may be difficult. Therefore, focus ion beam (FIB) operation can be utilized to form one or more through via 141 penetrating the protection layer 121 and the membrane 122, so that the efficiency and reliability of the through via 141 formation may be improved.

Furthermore, using certain types of conductive materials as the material of the first conductive layer 131 and the second conductive layer 132 may further alleviate damage to substrate 111 from certain chemicals. For example, using gold or platinum as the material of the first conductive layer 131 and the second conductive layer 132 may alleviate damage to substrate 111 from strong acid.

In addition, by utilizing the operations discussed in FIG. 6 to FIG. 19, the profile of the protection layer 121 and the membrane 122 not only can be configured to help protecting the substrate 111, but also alleviating the difficulty of FIB operation. Specifically, by using the operations discussed in FIG. 11 to FIG. 14B, the protection layer 121 can be formed while avoiding significantly increase the thickness of the membrane 122 that would be penetrated by FIB operation in subsequent operations.

Some embodiments of the present disclosure provide a fluid sensor, including a substrate including a first material and having a first surface and a second surface opposite to the first surface, wherein the substrate further comprises a recess recessed from the first surface, a first conductive layer over the first surface of the substrate, a protection layer between the first surface of the substrate and the first conductive layer, wherein the protection layer includes a second material, and a through via connected to the recess.

Some embodiments of the present disclosure provide a fluid sensor system, including a fluid supplier for supplying a fluid, and a fluid sensor at a downstream of the fluid supplier, wherein the fluid sensor includes a substrate, a chemical protection layer having a first portion over a first surface of the substrate, wherein the protection layer includes a material more anti-corrosive with respect to the fluid than a material of the substrate, and a recess penetrating the substrate.

Some embodiments of the present disclosure provide a method for fabricating a fluid sensor system, including forming a membrane over a backside of a substrate, forming a recess in the substrate to expose a portion of the membrane, forming a protection layer over a sidewall of the recess, forming a first conductive layer over the protection layer, and forming a through via penetrating the membrane.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A fluid sensor, comprising:
a substrate comprising a first material and having a first surface and a second surface opposite to the first surface, wherein the substrate further comprises a recess recessed from the first surface;
a first conductive layer over the first surface of the substrate, wherein a portion of the first conductive layer is in the recess;
a membrane over the second surface of the substrate, wherein the membrane contacts the first conductive layer at the second surface of the substrate;
a protection layer between the first surface of the substrate and the first conductive layer, wherein the protection layer comprises a second material, and the protection layer covering a sidewall of the recess and being covered by the portion of the first conductive layer in the recess; and
a through via connected to the recess, wherein the through via penetrates the first conductive layer, and a portion of a sidewall of the through via is defined by the first conductive layer.

2. The fluid sensor of claim 1, wherein the membrane comprises the second material.

3. The fluid sensor of claim 1, wherein the second material comprises silicon carbide.

4. The fluid sensor of claim 1, further comprising a second conductive layer stacked with the second surface of the substrate.

5. The fluid sensor of claim 1, wherein the protection layer covers an entirety of the sidewall of the recess, and the first conductive layer covers an entirety of the protection layer in the recess.

6. The fluid sensor of claim 1, wherein a sidewall of the membrane is substantially aligned with a sidewall of the first conductive layer, and a portion of the sidewall of the through via is defined in the membrane.

7. The fluid sensor of claim 1, wherein a portion of the membrane is free from being under a coverage of a vertical projection area of the substrate.

8. A fluid sensor system, comprising:
a fluid supplier for supplying a fluid; and
a fluid sensor at a downstream of the fluid supplier, wherein the fluid sensor comprises:
a substrate;
a recess penetrating the substrate;
a chemical protection layer having a first portion over a first surface of the substrate, a second portion lines a sidewall of the recess, and a third portion over a second surface of the substrate opposite to the first surface, wherein the chemical protection layer comprises a material more anti-corrosive with respect to the fluid than a material of the substrate;
a first conductive layer over the first surface of the substrate, wherein the chemical protection layer is between the first surface of the substrate and the first conductive layer, the first conductive layer covering the second portion of the chemical protection layer in the recess, the third portion of the chemical protection layer has a top surface facing the second surface of the substrate, and the top surface of the third portion contacts the first conductive layer; and
a through via connected to the recess, wherein the through via penetrates the first conductive layer, and a portion of a sidewall of the through via is defined by the first conductive layer.

9. The fluid sensor system of claim 1, wherein the first conductive layer further covers the first portion of the chemical protection layer and the fluid sensor system further comprises a second conductive layer on the third portion of the chemical protection layer.

10. The fluid sensor system of claim 9, further comprising a determination circuit electrically connected to the first conductive layer and the second conductive layer.

11. The fluid sensor system of claim 8, wherein the material of the chemical protection layer comprises silicon carbide.

12. The fluid sensor system of claim 8, wherein an entirety of the second portion of the chemical protection layer in the recess is covered by the first conductive layer.

13. A method for fabricating a fluid sensor, comprising:
forming a membrane over a backside of a substrate;
forming a recess from a front surface of the substrate to expose a portion of the membrane;
forming a protection layer over a sidewall of the recess;
forming a first conductive layer over the protection layer, wherein the protection layer is between the front surface of the substrate and the first conductive layer and between the sidewall of the recess and the first conductive layer in the recess, and the first conductive layer contacts the membrane at a bottom of the recess; and
forming a through via connected to the recess by penetrating the membrane and the first conductive layer, wherein a portion of the first conductive layer remains contacting with the membrane.

14. The method of claim 13, wherein forming the through via comprises: penetrating the membrane and the first conductive layer by a focus ion beam operation.

15. The method of claim 13, further comprising forming a first photoresist layer on a side of the membrane in contact with the substrate prior to forming the protection layer.

16. The method of claim 15, further comprising: removing the first photoresist layer subsequent to forming the protection layer.

17. The method of claim 13, further comprising: forming a second conductive layer over the membrane prior to forming the through via.

18. The method of claim 17, further comprising: forming a second photoresist layer prior to forming the second conductive layer.

19. The fluid sensor of claim 1, wherein the protection layer contacts the membrane at the second surface of the substrate.

20. The fluid sensor system of claim 8, wherein the third portion has an inner sidewall substantially aligning an inner sidewall of the first conductive layer.

* * * * *